United States Patent
Yoda et al.

(10) Patent No.: US 10,109,334 B2
(45) Date of Patent: Oct. 23, 2018

(54) MAGNETIC MEMORY

(71) Applicant: Kabushiki Kaisha Toshiba, Minato-ku (JP)

(72) Inventors: Hiroaki Yoda, Kawasaki (JP); Naoharu Shimomura, Meguro (JP); Yuichi Ohsawa, Yokohama (JP); Tadaomi Daibou, Yokohama (JP); Tomoaki Inokuchi, Yokohama (JP); Satoshi Shirotori, Yokohama (JP); Altansargai Buyandalai, Kawasaki (JP); Yuuzo Kamiguchi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/848,022

(22) Filed: Dec. 20, 2017

(65) Prior Publication Data
US 2018/0114558 A1    Apr. 26, 2018

Related U.S. Application Data

(62) Division of application No. 15/267,974, filed on Sep. 16, 2016, now Pat. No. 9,881,660.

(30) Foreign Application Priority Data

Dec. 14, 2015 (JP) ................. 2015-243603
Aug. 4, 2016 (JP) ................. 2016-153933

(51) Int. Cl.
*G11C 11/16* (2006.01)
*H01L 43/02* (2006.01)
(Continued)

(52) U.S. Cl.
CPC ...... *G11C 11/1675* (2013.01); *G11C 11/1659* (2013.01); *G11C 11/1673* (2013.01);
(Continued)

(58) Field of Classification Search
CPC .......... G11C 11/16; G11C 11/15; H01L 43/08
(Continued)

(56) References Cited

U.S. PATENT DOCUMENTS 9,076,537 B2    7/2015    Khvalkovskiy et al.
9,230,626 B2    1/2016    Buhrman et al.
(Continued)

FOREIGN PATENT DOCUMENTS

JP    2014-45196 A    3/2014

OTHER PUBLICATIONS

Yongbing Xu, et al., "Handbook of Spintronics" Springer Science+ Business Media Dordrecht, 2016, pp. 1031-1064 (with Cover Page).
(Continued)

*Primary Examiner* — Jason Lappas
(74) *Attorney, Agent, or Firm* — Oblon, McClelland, Maier & Neustadt, L.L.P.

(57) ABSTRACT

A magnetic memory according to an embodiment includes: a conductive layer including a first and second terminals; a plurality of magnetoresistive elements separately disposed on the conductive layer between the first and second terminals, each magnetoresistive element including a reference layer, a storage layer between the reference layer and the conductive layer, and a nonmagnetic layer between the storage layer and the reference layer; and a circuit configured to apply a first potential to the reference layers of the magnetoresistive elements and to flow a first write current between the first and second terminals, and configured to apply a second potential to the reference layer or the reference layers of one or more of the magnetoresistive elements to which data is to be written, and to flow a second write current between the first and second terminals in an opposite direction to the first write current.

20 Claims, 26 Drawing Sheets

(51) Int. Cl.
H01L 27/22 (2006.01)
H01L 43/08 (2006.01)
G11C 11/15 (2006.01)

(52) U.S. Cl.
CPC .......... *H01L 27/224* (2013.01); *H01L 27/228* (2013.01); *H01L 43/02* (2013.01); *H01L 43/08* (2013.01); *G11C 11/15* (2013.01); *G11C 11/16* (2013.01)

(58) Field of Classification Search
USPC .................................................. 365/158, 171
See application file for complete search history.

(56) References Cited

U.S. PATENT DOCUMENTS

| 9,236,105 | B2 | 1/2016 | Pi et al. | |
|---|---|---|---|---|
| 2014/0056060 | A1* | 2/2014 | Khvalkovskiy | ....... H01L 27/228 365/158 |
| 2014/0301138 | A1* | 10/2014 | Mani | ....................... G11C 11/36 365/171 |

OTHER PUBLICATIONS

H. Yoda, et al., "The Progresses of MRAM as a Memory to Save Energy Consumption and Its Potential for Further Reduction" 2015 Symposium on VLSI Technology Digest of Technical Papers, JFS2-1 (Invited), 2015, pp. T104 and T105.

H. Yoda, et al., "Progress of STT-MRAM Technology and the Effect on Normally-off Computing Systems" IEDM Tech. Dig. 2012, pp. 11.3.1-11.3.4.

Yoichi Shiota, et al., "Induction of coherent magnetization switching in a few atomic layers of FeCo using voltage pulses" Nature Materials, Letters, vol. 11, Jan. 2012, pp. 39-43.

Luqiao Liu, et al., "Spin-Torque Switching with the Giant Spin Hall Effect of Tantalum" Research Article, Science, vol. 336, May 4, 2012, Downloaded from www.sciencemag.org on Jun. 25, 2015, pp. 555-558.

* cited by examiner

MAGNETIC MEMORY

CROSS REFERENCE TO RELATED APPLICATIONS

This application is division of and claims the benefit of priority under 35 U.S.C. § 120 from application Ser. No. 15/267,974 filed Sep. 16, 2016, and claims the benefit of priority under 35 U.S.C. § 119 from Japanese Patent Application Nos. 2015-243603 filed Dec. 14, 2015 and No. 2016-153933 filed Aug. 4, 2016, the entire contents of each of which are incorporated herein by reference.

FIELD

Embodiments described herein relate generally to magnetic memories.

BACKGROUND

Existing memories may be classified into volatile working memories (such as static random access memories (SRAMs) and dynamic random access memories (DRAMs)), and nonvolatile storage memories (such as NAND flash memories and hard disk drives (HDDs)). The volatile memories consume large energy due to leakage current caused in SRAMs, and refresh current caused in DRAMs.

In order to solve this problem, various nonvolatile memories have been considered as working memories replacing SRAMs and DRAMs.

The working memories, however, are accessed more often in an active state than in a standby state. Since a large writing charge (Qw) is required in the active state, energy required for a write operation increases. As a result, the energy saved during the standby state due to their nonvolatile characteristic is completely consumed in the active state, and therefore the total energy consumption is difficult to be decreased. This is called "nonvolatile memories' historical dilemma." No existing product has solved this problem.

Recently simulation using state-the-art MTJ performance was performed. The simulation result showed reduction in energy consumption if a STT (Spin Transfer Torque)-MRAM (Magnetic Random Access Memory) is used as a lowest level cache memory (LLC (Last Level Cache)).

If the STT-MRAM is used as a cache memory in a layer upper than the LLC, the frequency at which it is accessed considerably increases. Therefore, considerable energy is consumed. Therefore, the aforementioned energy consumption problem cannot be solved.

DETAILED DESCRIPTION

A magnetic memory according to an embodiment includes: a conductive layer including a first terminal and a second terminal; a plurality of magnetoresistive elements separately disposed on the conductive layer between the first terminal and the second terminal, each magnetoresistive element including a reference layer, a storage layer between the reference layer and the conductive layer, and a nonmagnetic layer between the storage layer and the reference layer; and a circuit configured to apply a first potential to the reference layers of the magnetoresistive elements and to flow a first write current between the first terminal and second terminal, and configured to apply a second potential to the reference layer or the reference layers of one or more of the magnetoresistive elements to which data is to be written, and to flow a second write current between the first terminal and the second terminal in an opposite direction to the first write current.

Embodiments will now be described with reference to the accompanying drawings.

First Embodiment

Figure 1:
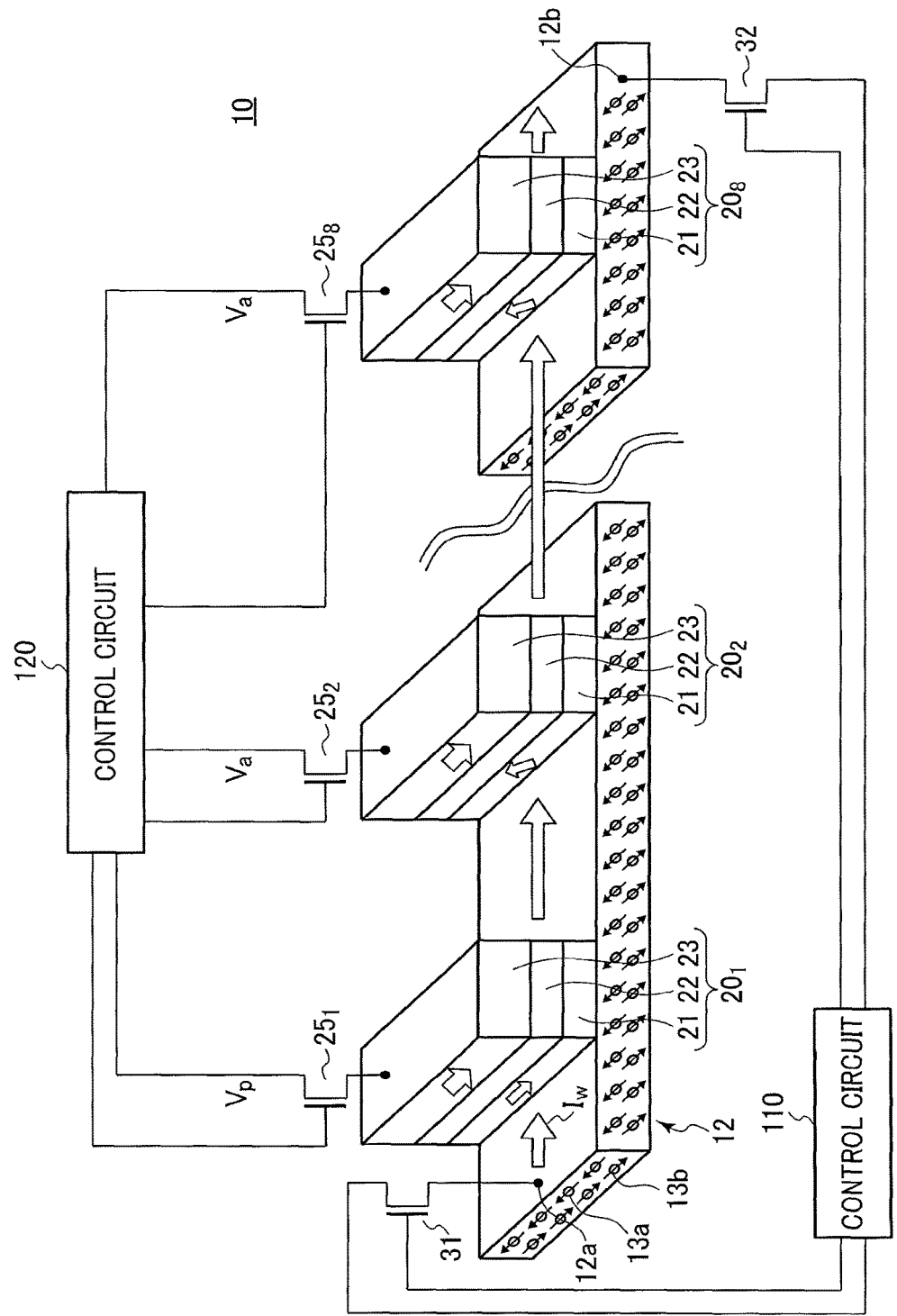
FIG. 1 is a perspective view of a unit string of the magnetic memory-cell of a magnetic memory according to a first embodiment.

A magnetic memory according to a first embodiment will be described with reference to FIGS. 1 to 3. The magnetic memory according to the first embodiment includes at least one unit string of the memory cells. FIG. 1 shows the configuration of one unit string of the memory cells. The memory cell 10 includes a conductive layer 12, a plurality of (for example eight) magnetoresistive elements $20_1$ to $20_8$ separately disposed on one surface of the conductive layer 12, transistors $25_i$ each corresponding to one of the magnetoresistive elements $20_i$ (i=1, . . . , 8), transistors 31 and 32 configured to cause a current to flow through the conductive layer 12, and control circuits 110 and 120. The transistors $25_i$ may be replaced by diodes of omitted with properly designed circuits.

The conductive layer 12 may contain a metal such as Ta, W, and Pt for example. A write current $I_w$ flows through the conductive layer 12. The direction of the current flowing through the conductive layer 12 is controlled by the control circuit 110. When the current flows through the conductive layer 12, electrons 13a with up spin and electrons 13b with down spin also flow. The directions of spins of the electrons 13a and 13b are indicated by arrows.

Each magnetoresistive element $20_i$ (i=1, . . . , 8) has a multilayer structure including a storage layer 21 disposed on the conductive layer 12, a nonmagnetic layer 22 disposed on the storage layer 21, and a reference layer 23 disposed on the nonmagnetic layer 22. The magnetoresistive element $20_i$ (i=1, . . . , 8) may be a magnetic tunnel junction (MTJ) element in which the nonmagnetic layer 22 is an insulating layer, or a giant magneto-resistive (GMR) element in which the nonmagnetic layer 22 is a nonmagnetic metal layer. If the magnetoresistive element is an MTJ element in which the direction of magnetization of the storage layer 21 and the direction of magnetization of the reference layer 23 are parallel to the film plane, i.e., if the magnetoresistive element is an in-plane magnetization MTJ element in which the direction of magnetization is perpendicular to the stacking direction in the multilayer structure, the storage layer 21 may be a CoFeB layer, for example, and the nonmagnetic layer 22 may be a MgO layer, for example. The reference layer 23 may have a synthetic antiferromagnetic multilayer structure including, for example, a CoFeB layer, a Ru layer disposed on the CoFeB layer, and a CoFe layer disposed on the Ru layer, the CoFeB layer and the CoFe layer being antiferromagnetically coupled via the Ru layer. The in-plane magnetization MTJ element may also include an antiferromagnetic layer of IrMn, for example, disposed on the reference layer 23 to fix the magnetization of the reference layer 23. Although the magnetoresistive elements $20_1$ to $20_8$ are disposed on the conductive layer 12 in FIG. 1, they may be disposed under the conductive layer 12. The magnetoresistive elements $20_1$ to $20_8$ act as memory elements.

The MTJ element is patterned to have a rectangular top shape, and has a shape magnetic anisotropy. Therefore, the longitudinal direction is a stable magnetization direction in the storage layer and the reference layer. Examples of stable magnetization directions of the storage layers and the references layers are indicated by arrows in FIG. 1. This stability is called (longitudinal) uniaxial magnetic anisotropy. The uniaxial magnetic anisotropy is dependent on the aspect ratio of the rectangular shape, the thickness of the storage layer, and the magnetization of the magnetic layers. The write current threshold value $I_{co}$, which will be described later, is proportional to the uniaxial magnetic anisotropy. Each magnetoresistive element $20_i$ (i=1, . . . , 8) is a 1-bit storage element, and the memory cell 10 is, for example, a 1-byte cell including 8 bits. The memory cell 10 may also include one or more dummy magnetoresistive elements that are not used as storage elements.

One of source and drain ("first terminal") of the transistor $25_i$ (i=1, . . . , 8) is electrically connected to the reference layer 23 of the corresponding magnetoresistive element $20_i$, the other ("second terminal") is connected to a selection line (not shown) for selecting the memory cell, and a gate ("control terminal") is connected to a selection line (not shown) for selecting the magnetoresistive element $20_i$. Therefore, each transistor $25_i$ (i=1, . . . , 8) is also called a bit selection transistor for selecting a corresponding magnetoresistive element $20_i$. The magnetoresistive element $20_i$ (i=1, . . . , 8) has a first terminal connecting to the conductive layer 12 and a second terminal connecting to the first terminal of the corresponding bit selection transistor $25_i$. The gate and the second terminal of each of the bit selection transistors $25_1$ to $25_8$ are connected to the control circuit 120. The control circuit 120 controls whether each bit selection transistor is in the ON or OFF state, and the potential applied to the reference layer of the corresponding one of the magnetoresistive elements $20_1$ to $20_8$.

One of source and drain ("first terminal") of the transistor 31 is connected to one (12a) of two terminals 12a and 12b of the conductive layer 12, and the other ("second terminal") is connected to a power supply or current source. A gate of the transistor 31 ("control terminal") receives a signal for selecting the memory cell 10. One of source and drain ("first terminal") of the transistor 32 is connected to the other (12b) of the two terminals 12a and 12b of the conductive layer 12, and the other of the source and the drain ("second terminal")

is connected to the power supply or current source. A gate ("control terminal") of the transistor 32 receives a signal for selecting the memory cell 10. A write current is caused to flow between the transistors 31 and 32 through the conductive layer 12. As a result, data may be written to the storage layer 21 of each magnetoresistive element $20_i$ (i=1, . . . , 8). The transistors 31 and 32 are called byte selection transistors. The gates of the byte selection transistors 31 and 32 are connected to the control circuit 110 to allow the control circuit 110 to control the ON or OFF state of the byte selection transistors 31 and 32. The control circuit 110 also controls the direction of the current flowing through the conductive layer 12. The transistor 32 may be omitted, and the second terminal 12b of the conductive layer 12 may be grounded.

In the following descriptions, each magnetoresistive element $20_i$ (i=1, . . . , 8) is an MTJ element. The nonmagnetic layer 22, for example the MgO layer, of each MTJ element has a sufficient thickness (for example, about 2 nm), and the tunneling current flowing through the nonmagnetic layer 22 is set to be the order of μA. As a result, when the bit selection transistor $25_i$ (i=1, . . . , 8) is turned ON by the control circuit 120, a voltage of about 0.5 V may be applied to the storage layer 21.

A properly chosen polarity of voltage applied to an MTJ element introduces perpendicular magnetic anisotropy to the storage layer of the MTJ element, and the magnetization of the storage layer is caused to have a vertical component or to grow precession easier. As a result, the stability of magnetization (uniaxial magnetic anisotropy) to write current is weakened. Thus, if one of the bit selection transistors $25_i$ (i=1, . . . , 8) is turned ON, the write current threshold value $I_{co}$ of this bit may be lowered. This state is called half-selected bit state, and the write current threshold value in this state is denoted by $I_{ch}$. In the first embodiment, the parameters of the storage layer 21, for example, may be set so that the current threshold value $I_{ch}$ is expressed as:

$$I_{ch} \sim I_{co}/2 \quad (1)$$

which means that $I_{ch}$ is substantially a half of $I_{co}$.

The conductive layer 12 includes a material causing spin orbit coupling or the Rashba effect. The conductive layer 12 is disposed under the MTJ elements to electrically connect adjacent MTJ elements in series. Typically, eight (1 byte) MTJ elements are connected in series. The thickness of the conductive layer 12 is generally about 10 nm, and the sheet resistance of the conductive layer 12 is as small as about 1000Ω. This allows the eight (1 byte) MTJ elements to be connected in series. The series resistance of the MTJ elements is about kΩ, which is about the same as that of a minute transistor. Therefore, a required write current may be supplied.

When the byte selection transistors 31 and 32 are turned ON by the control circuit 110, a write current $I_w$ flows through the conductive layer 12. In the memory cell 10 shown in FIG. 1, spin-polarized elections 13a having spin toward the depth side in FIG. 1 are accumulated near the top surface of the conductive layer 12, and polarized electrons 13b having spin toward the front side in FIG. 1 are accumulated near the lower surface of the conductive layer 12 due to the electron scattering caused by the spin orbit coupling.

If no bit has been selected in the memory cell 10, data may be written to the MTJ element due to the interaction (spin transfer torque) of the accumulated polarized electrons and the magnetization of the storage layer 21 when the write current $I_w$ exceeds the threshold current which is roughly the order of $I_{c0}$.

If a bit has been half-selected, data may be written to the MTJ element due to the interaction (spin transfer torque) of the accumulated spin-polarized electrons and the magnetization of the storage layer 21 when the write current $I_w$ exceeds $I_{ch}$, the order of a half of the threshold current $I_{c0}$ ($I_{c0}/2$).

(Write Method)

A method of writing data to the memory cell 10 shown in FIG. 1 will be described below with reference to FIGS. 2 and 3. In this embodiment, data is written to the memory cell 10 in two stages. In FIGS. 2 and 3, 1 byte data (0, 1, 1, 0, 0, 0, 0, 1) is written to the memory cell 10.

Figure 2:
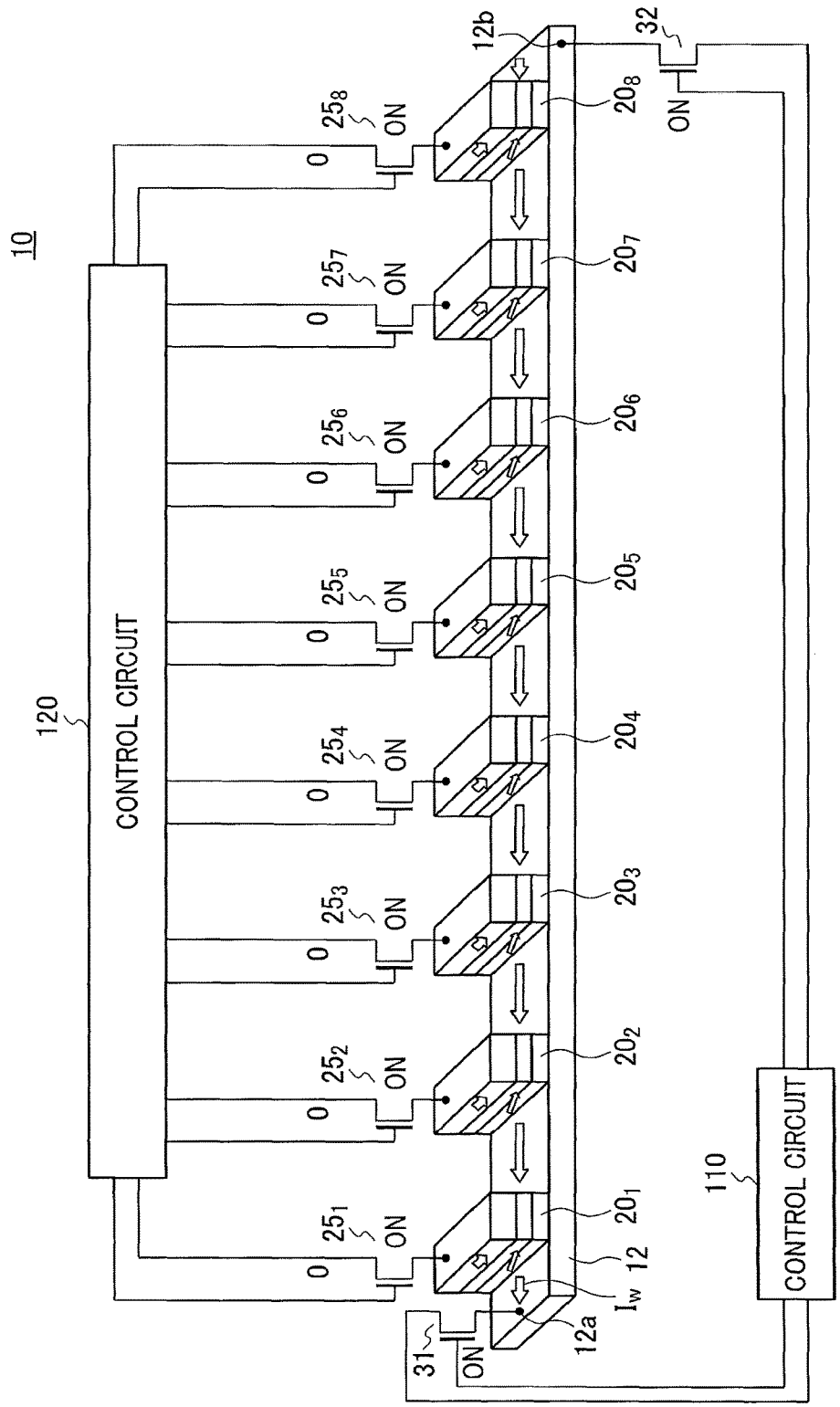
FIG. 2 is an explanatory diagram illustrating a write method for the memory cell of the magnetic memory according to the first embodiment.
Figure 3:
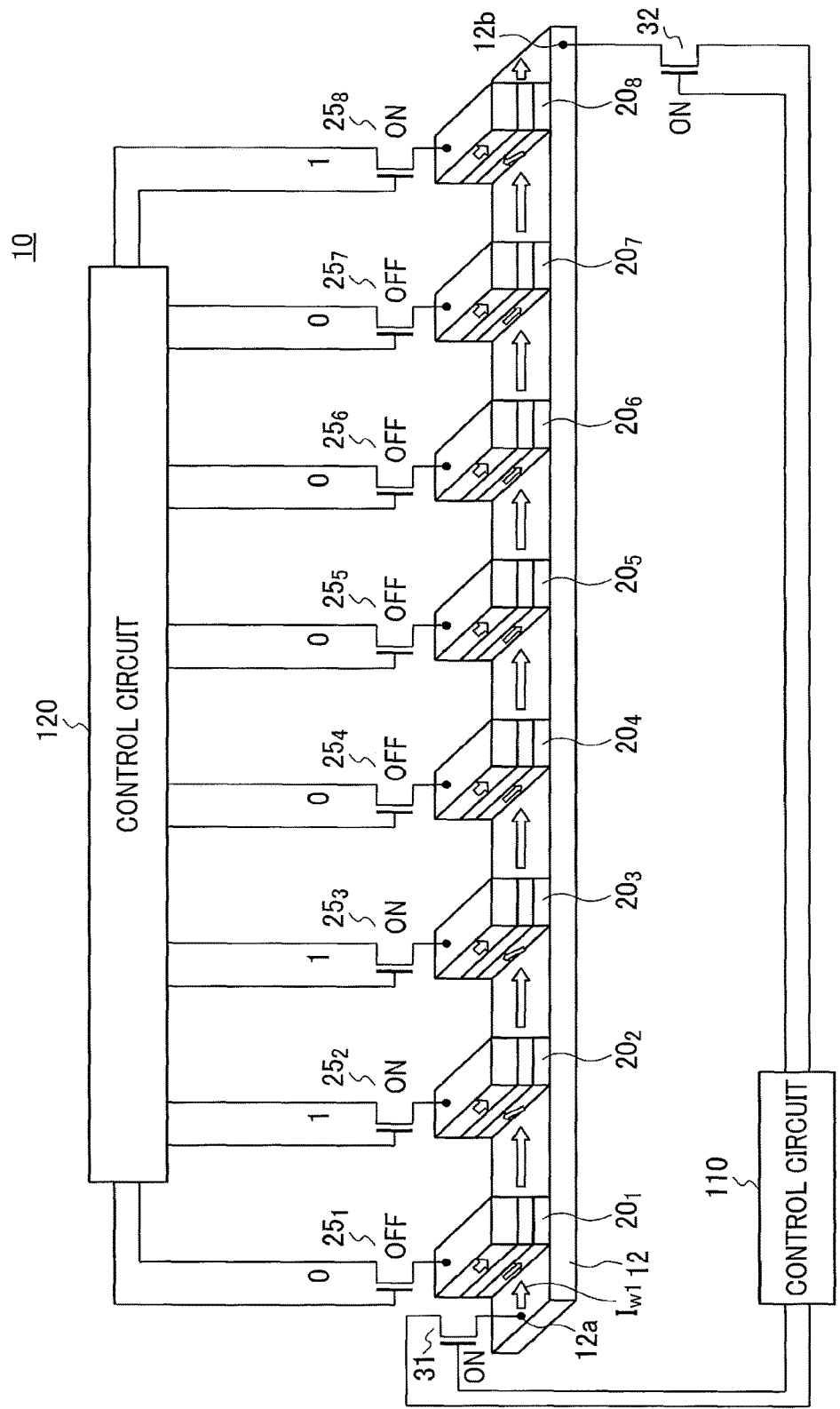
FIG. 3 is an explanatory diagram illustrating the write method for the memory cell of the magnetic memory according to the first embodiment.

First, the byte selection transistors 31 and 32 and the bit selection transistors $25_1$ to $25_8$ are turned ON by the control circuit 110 and the control circuit 120 to apply a first potential (for example, a positive potential) to the reference layers 23 of the MTJ elements $20_1$ to $20_8$ and cause a write current $I_w$ to flow between the first terminal 12a and the second terminal 12b of the conductive layer 12, as shown in FIG. 2. This weakens the magnetization stability to write current (uniaxial magnetic anisotropy) of the storage layers 21 of all the MTJ elements $20_1$ to $20_8$, and therefore the threshold current of the MTJ elements changes roughly from $I_{c0}$ to $I_{ch}$. As a result, data "0" is written to all of the MTJ elements $20_1$ to $20_8$ with a write current $I_{w0}$ ($I_w > I_{w0} > I_{ch}$). As a result, the MTJ elements $20_1$ to $20_8$ have data (0, 0, 0, 0, 0, 0, 0, 0). Generally, If the write current is about 1.5 times the threshold current $I_{ch}$, the write error rate may be about $10^{-11}$. Therefore, the $I_{w0}$ may roughly be expressed as:

$$I_{w0} \sim 1.5 I_{ch} \quad (2)$$

The polarity of the voltage and whether the perpendicular magnetic anisotropy is improved or degraded change depending on the nonmagnetic layer material and the storage layer material.

In the simulation that will be described below, the perpendicular anisotropy characteristic of the storage layer is assumed to be improved when a positive voltage is applied to the reference layer, and to be degraded when a negative voltage is applied.

Figure 11:
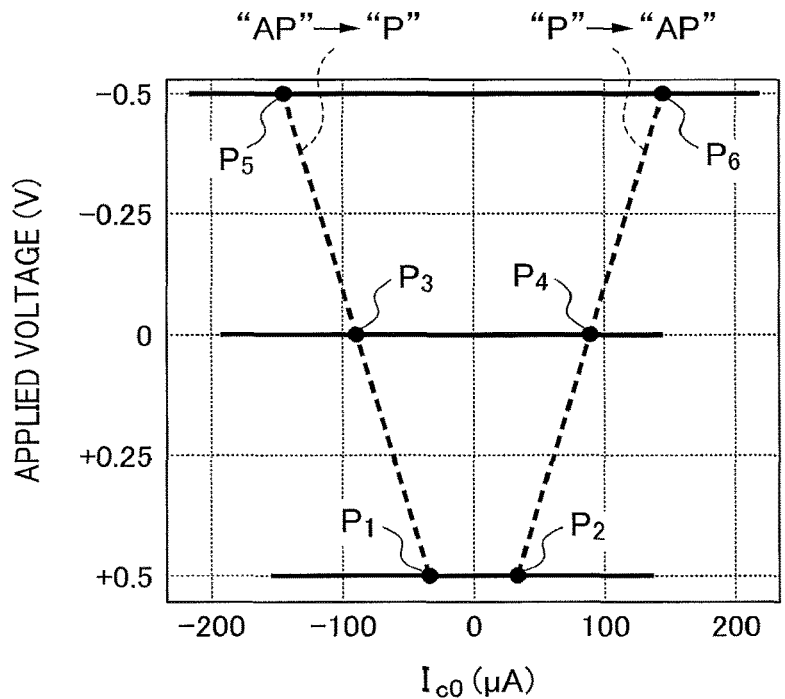
FIG. 11 is a diagram showing a result of a simulation for obtaining a relationship between a voltage applied to a reference layer of an MTJ element and a threshold current of the MTJ element.
Figure 12A:
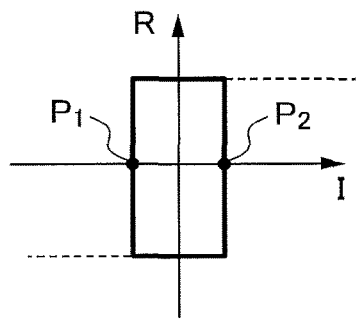
FIG. 12A is a diagram showing hysteresis characteristics of resistance value relative to current value when a positive voltage is applied to a reference layer of an MTJ element.
Figure 12B:
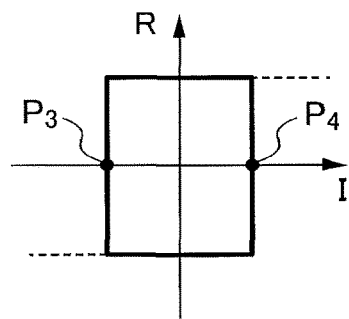
FIG. 12B is a diagram showing hysteresis characteristics of resistance value relative to current value when no voltage is applied to the reference layer of the MTJ element.
Figure 12C:
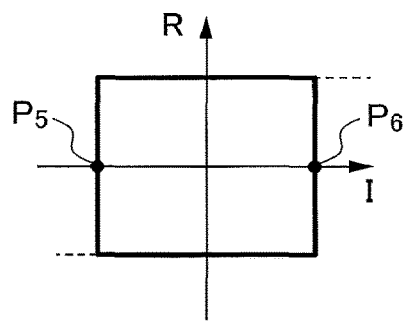
FIG. 12C is a diagram showing hysteresis characteristics of resistance value relative to current value when a negative voltage is applied to the reference layer of the MTJ element.

FIGS. 11 to 12C show simulation results proving the foregoing descriptions. FIG. 11 shows the simulation results of the threshold current $I_{c0}$ at which the direction of magnetization is switched in the storage layer of the MTJ element when voltages +0.5V, 0V, −0.5V are applied to the reference layer of the MTJ element and a current is caused to flow through the conductive layer. In FIG. 11, the vertical axis represents the voltage applied to the reference layer of the MTJ element, and the horizontal axis represents the threshold current $I_{c0}$.

The point $P_1$ in FIG. 11 indicates that when a voltage +0.5 V is applied to the reference layer of the MTJ element, the magnetization direction of the storage layer changes from an antiparallel (AP) state to a parallel (P) state relative to the magnetization direction of the reference layer, and the point $P_2$ indicates that when a voltage +0.5 V is applied to the reference layer of the MTJ element, the magnetization direction of the storage layer changes from the parallel (P) state to the antiparallel (AP) state relative to the magnetization direction of the reference layer.

The point $P_3$ indicates that when a voltage 0 V is applied to the reference layer of the MTJ element, the magnetization direction of the storage layer changes from the antiparallel (AP) state to the parallel (P) state relative to the magnetization direction of the reference layer, and the point $P_4$ indicates that when a voltage 0 V is applied to the reference layer of the MTJ element, the magnetization direction of the storage layer changes from the parallel (P) state to the antiparallel (AP) state relative to the magnetization direction of the reference layer.

The point $P_5$ indicates that when a voltage -0.5 V is applied to the reference layer of the MTJ element, the magnetization direction of the storage layer changes from the antiparallel (AP) state to the parallel (P) state relative to the magnetization direction of the reference layer, and the point $P_6$ indicates that when a voltage -0.5V is applied to the reference layer of the MTJ element, the magnetization direction of the storage layer changes from the parallel (P) state to the antiparallel (AP) state relative to the magnetization direction of the reference layer. The broken line connecting the points $P_1$, $P_3$, and $P_5$ indicates the change in threshold current $I_{c0}$ by which the MTJ element changes from the AP state to the P state when the voltage applied to the reference layer of the MTJ element is changed between +0.5 V and -0.5 V. The broken line connecting the points $P_2$, $P_4$, and $P_6$ indicates the changes in threshold current $I_{c0}$ by which the MTJ element changes from the P state to the AP state when the voltage applied to the reference layer of the MTJ element is changed between +0.5 V and -0.5 V.

FIGS. 12A to 12C each show hysteresis curves when a voltage selected from +0.5 V, 0 V, and -0.5 V is applied to the reference layer of the MTJ element. The vertical axis of each hysteresis curve diagram represents the resistance R of the MTJ element, and the horizontal axis represents the current I flowing through the conductive layer. The points $P_1$ to $P_6$ in FIGS. 12A to 12C correspond to the points $P_1$ to $P_6$ shown in FIG. 11, respectively.

As can be understood from FIGS. 11 to 12C, applying a higher positive voltage to the reference layer of the MTJ element leads to a lower threshold current $I_{c0}$ than that when no voltage is applied. On the contrary, applying a lower negative voltage to the reference layer of the MTJ element leads to a higher threshold current $I_{c0}$ than that when no voltage is applied.

Figure 13:
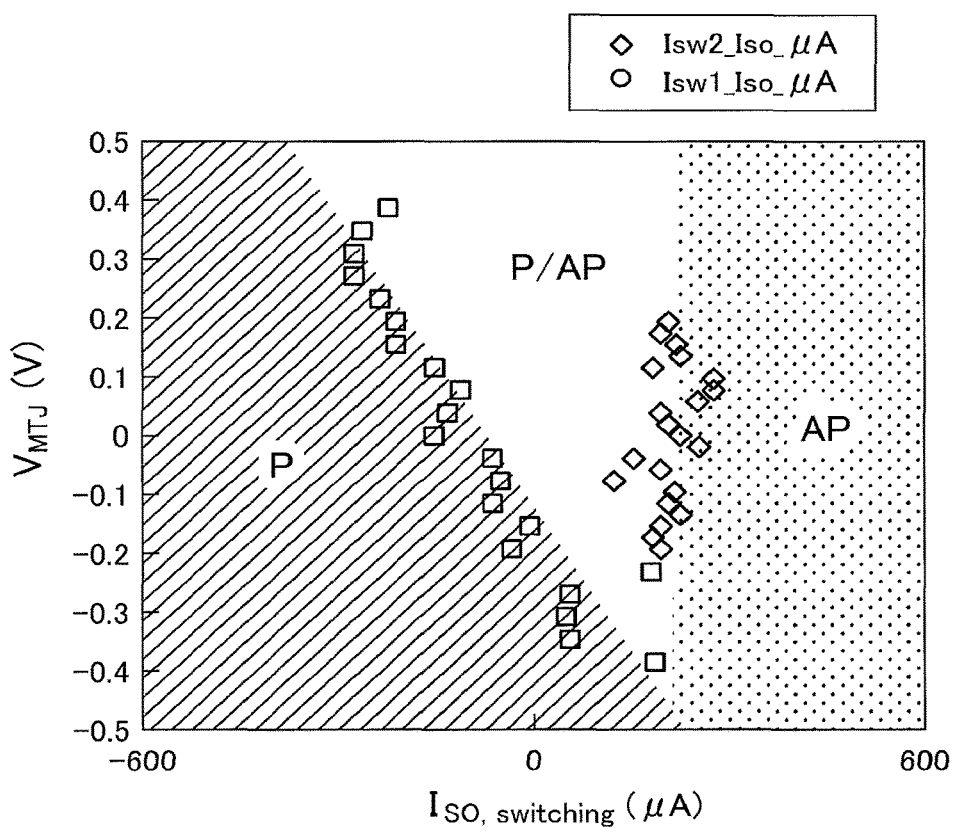
FIG. 13 is a diagram showing the relationship, obtained by an experiment, between value of voltage applied to an MTJ element and value of switching-current flows through a conductive layer, by which magnetization of a storage-layer is switched.

FIG. 13 shows a result of an experiment for obtaining a relationship between a voltage applied to the MTJ element and a value $I_{SO,switching}$ of a current flowing through the conductive layer, at which the magnetization switching occurs, in the memory cell according to the first embodiment.

In this experiment, a combination of MgO and CoFeB is used to form the combination of the nonmagnetic material layer and the storage layer. With this combination of materials, the anisotropy of the storage layer is degraded when a positive voltage is applied to the reference layer, and improved when a negative voltage is applied. It is opposite to the assumption of the simulation. As mention above, this characteristic depends on materials selection of tunneling barriers, storage layers, etc.

The vertical axis in FIG. 13 represents voltage $V_{MTJ}$ applied to the MTJ element, and the horizontal axis represent current $I_{SO,switching}$ flowing through the conductive layer, at which magnetization switching occurs.

The region denoted by "P" in FIG. 13 indicates that the magnetization direction of the storage layer is in a parallel state relative to the magnetization direction of the reference layer in the MTJ element, and the region denoted by "AP" indicates that the magnetization direction of the storage layer is in the antiparallel state relative to the magnetization direction of the reference layer in the MTJ element. The current I flowing through the conductive layer is measured by the pulse width of ms, and the absolute value of the current I may be lower than the value of the threshold current $I_{c0}$ on the ns order in FIG. 13. However, the changes in the threshold current $I_{c0}$ in response to the application of a voltage confirm that the simulation results may be substantially correct.

Next, the bit selection transistors connecting to bits to which data "1" is to be written, for example the bit selection transistors $25_2$, $25_3$, and $25_8$, are turned ON by the control circuit 120, and a second potential (for example, a positive potential) is applied to the reference layers 23 of the MTJ elements $20_2$, $20_3$, and $20_8$. The byte selection transistors 31 and 32 are also turned ON by the control circuit 110, and a write current $I_{w1}$ ($I_{c0} > I_{w1} > I_{ch}$) is caused to flow through the conductive layer 12 in a direction opposite to the direction for writing data "0". As a result, data "1" is written to the storage layers 21 of the MTJ elements $20_2$, $20_3$, and $25_8$ (FIG. 3). In this case, $I_{w1}$ is substantially the same value as 1.5 times $I_{ch}$, and may be expressed as:

$$I_{w1} \sim 1.5 I_{ch} \tag{3}$$

After the two write operation, 1 byte data (0, 1, 1, 0, 0, 0, 0, 1) may be written. The two write operation is made possible by cooperation of the control circuit 110 and the control circuit 120. Specifically, a first write circuit for performing the first write operation and a second write circuit for performing the second write operation both include the control circuit 110 and the control circuit 120.

A writing principle, called "spin transfer torque (STT) write method," in which spin-polarized electrons are introduced to a storage layer via a tunnel barrier, has been often discussed.

The write method used in this embodiment is a combination of a spin orbit torque (SOT) method and a voltage-controlled writing method in which a bit is half-selected. The SOT writing method is based on the interaction of polarized electrons and the electrons in the storage layer, which is the same as the writing principle of the STT method. Therefore, there is no great difference in write current threshold value between the STT method and the SOT method.

In this embodiment, the writing charge required for 1 bit, $q_w = Q_w/\text{bit}$, may be expressed as:

$$q_w = (I_{w1} \times t_p + I_{w0} \times t_p)/8 \tag{4}$$

where $t_p$ is write pulse width.

The writing charge per 1 bit, $q_w' = Q_w'/\text{bit}$, for the STT writing and the writing charge per 1 bit, $q_w'' = Q_w''/\text{bit}$, for the SOT writing may be expressed as:

$$q_w' = q_w'' = (I_w' \times t_p)/1 \tag{5}$$
$$= 1.5 I_{c0}$$

Therefore, the writing charge ratio ($q_w/q_w'$, $q_w/q_w''$) per 1 bit in the first embodiment may be expressed as follows:

$$q_w/q_w' = q_w/q_w''$$
$$= \{(I_{w1} \times t_p + I_{w0} \times t_p)/8\}/\{(I_w' \times t_p)/1\}$$
$$= (I_{w1} + I_{w0})/(8 I_w') = 3 I_{ch}/(12 I_{c0})$$
$$= 3 I_{ch}/(24 I_{ch}) = 3/24 = 1/8$$

Thus, the first embodiment may reduce the writing charge to ⅛, and the difference is almost nearly one order of magnitude. As a result, the writing energy may also be reduced to ⅛, and the difference is almost nearly one order of magnitude.

Figure 4:
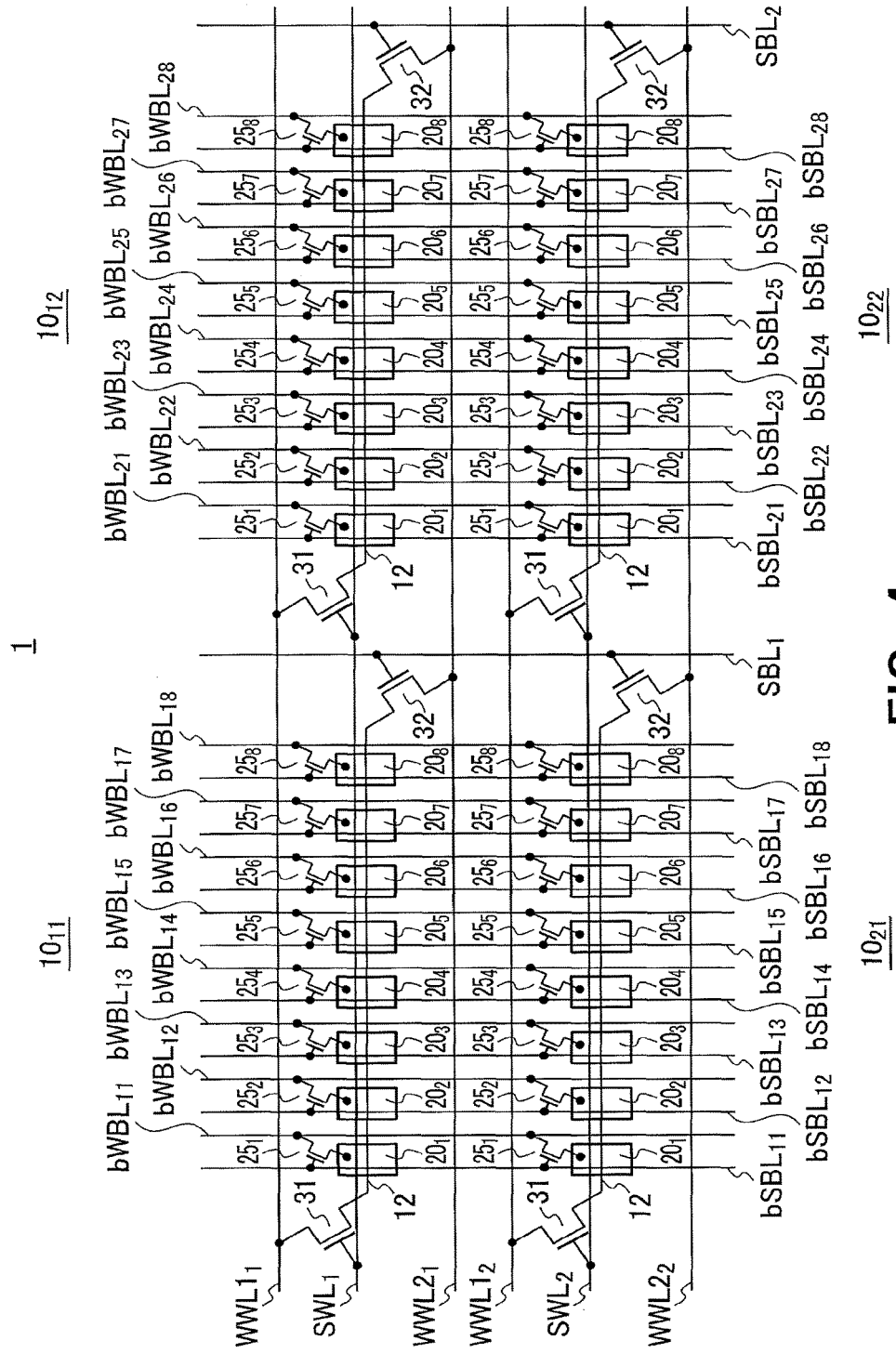
FIG. 4 is a circuit diagram of the magnetic memory according to the first embodiment.

A method of selecting a bit, to which data is written, in a magnetic memory including memory cells arranged in an array form, each being the memory cell 10 shown in FIG. 1, will be described with reference to FIGS. 4 and 5. FIG. 4 is a circuit diagram showing a magnetic memory 1 in which memory cells each being the memory cell 10 shown in FIG. 1 are arranged in a 2×2 array. The magnetic memory includes the memory cells $10_{11}$, $10_{12}$, $10_{21}$, $10_{22}$ arranged in the 2×2 array.

In the memory cells $10_{i1}$ and $10_{i2}$ in the i-th (i=1, 2) row, the control terminal of the byte selection transistor 31 is connected to a byte selection word line $SWL_i$, and the second terminal is connected to a first writing word line $WWL1_i$, and the second terminal of the byte selection transistor 32 is connected to a second writing word line $WWL2_i$. In the memory cells $10_{1j}$ and $10_{2j}$ in the j-th (j=1, 2) column, the control terminal of the byte selection transistor 32 is connected to a byte selection bit line $SBL_j$.

In each memory cell $10_{ij}$ (i, j=1, 2), the control terminal of the bit selection transistor $25_k$ (k=1, . . . , 8) is connected to a bit selection bit line $bSBL_{jk}$, and the second terminal is connected to a writing bit line $bWBL_{jk}$.

Figure 5:
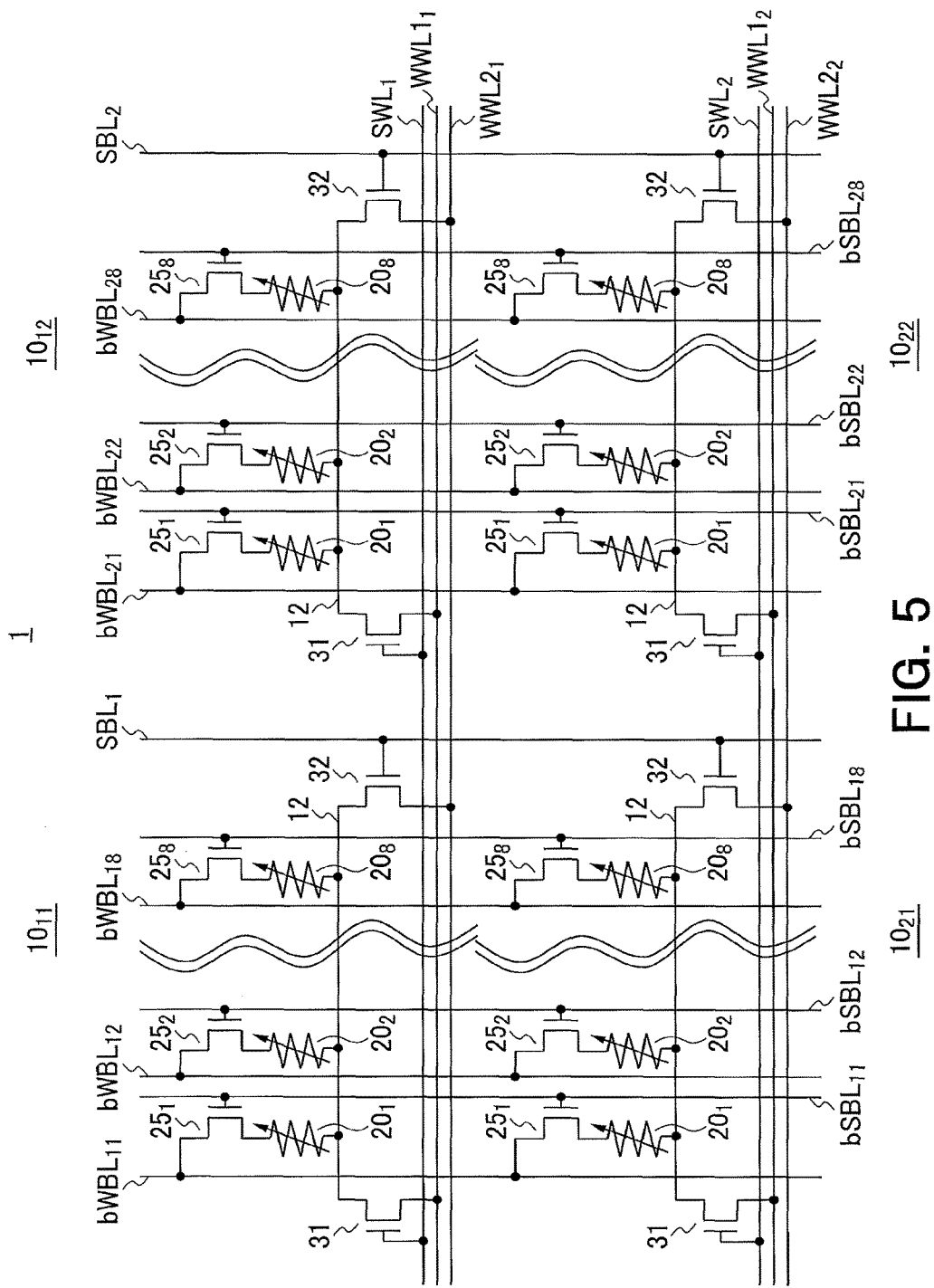
FIG. 5 is a diagram illustrating an example of an equivalent circuit of the magnetic memory according to the first embodiment.

FIG. 5 shows an example of an equivalent circuit of the magnetic memory 1 having the above configuration.

A method of selecting, for example, the MTJ elements $20_2$, $20_3$, and $20_8$ of the memory cell $10_{12}$ shown in FIGS. 4 and 5 will be described below. First, a byte to which data is written is selected by activating the byte selection word line $SWL_1$, the byte selection bit line $SBL_2$, the first writing word line $WWL1_1$, and the second writing word line $WWL2_1$. During the selection of the byte, the bit selection bit lines $bSBL_{22}$, $bSBL_{23}$, and $bSBL_{28}$, and the writing bit lines $bWBL_{22}$, $bWBL_{23}$, and $bWBL_{28}$ are activated in advance and brought into the half-selection state. This allows data to be written to the selected bits (for example, the MTJ elements $20_2$, $20_3$, and $20_8$) of the selected byte (for example, the memory cell $10_{12}$).

A read operation is performed in the following manner. If, for example, data is read from the memory cell $10_{12}$, the byte selection transistors 31 and 32 and the bit selection transistors $25_1$ to $25_8$ of the memory cell $10_{12}$ are turned ON, bits from which data is read are selected, and the resistance of each of the selected bits is measured by a current flowing through the writing bit lines $bWBL_{21}$ to $bWBL_{28}$ to determine the data. The resistance of each of the selected bits may be measured by causing a constant current to flow through the writing bit lines $bWBL_{21}$ to $bWBL_{28}$, and measuring a voltage between the reference layer and the storage layer of each of the selected bits (MTJ elements).

Although the bits are selected to be brought into the half-selection state in the above operation, the bits may be selected to increase the uniaxial magnetic anisotropy so that data may not to be written to the bits easily by, for example, applying a negative potential on the reference layers 23 of the selected bits. In this case, data is written to the non-selected bits. This has been described with reference to FIGS. 11 to 13.

Erroneous writing caused during a read operation may be completely prevented by setting (the polarity of) the voltage so as not to write data easily. In the STT writing method, however, the spin torque acts with both polarities. Therefore, erroneous writing during a read operation may not be prevented easily. This problem is called "read disturb," and is one of the great hindrances to the improvement of capacity (scaling) of STT-MRAM.

In the embodiments described above and later, in-plane magnetization MTJ elements will be described. However, the magnetoresistive elements are not limited to the in-plane magnetization type, but perpendicular magnetization MTJ elements, for example, may also be used. Like the in-plane magnetization MTJ elements, bits in the perpendicular magnetization MTJ elements are selected by turning ON the bit selection transistors, and controlling the writing threshold current to become lower or higher.

(First Modification)

A magnetic memory according to a first modification of the first embodiment will be described with reference to FIGS. 14A to 14C.

The magnetic memory according to the first modification has a configuration in which the bit selection transistors $25_1$ to $25_8$ connected to the reference layers 23 of the respective MTJ elements are removed from the magnetic memory according to the first embodiment shown in FIG. 1, and the control circuit 120 controls the voltages applied to the reference layers 23, including the timing at which the voltages are applied.

Figure 14A:
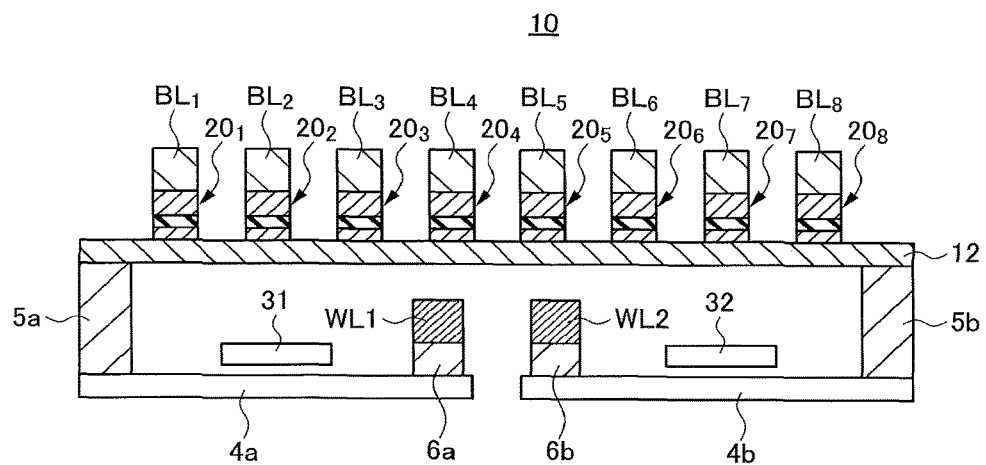
FIG. 14A is a cross-sectional view illustrating a unit string of the magnetic memory-cell according to a first modification of the first embodiment.
Figure 14B:
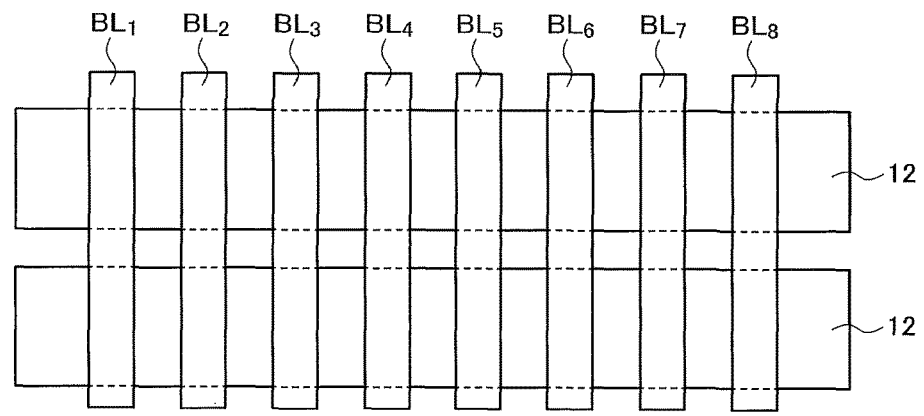
FIG. 14B is a plan view of the magnetic memory-cells according to the first modification of the first embodiment.

FIG. 14A and FIG. 14B are a cross-sectional view and a plan view of a memory cell of the magnetic memory according to the first modification, respectively. The transistors 31 and 32 for controlling the ON/OFF state of the write current are disposed under the conductive layer 12 on which the MTJ elements $20_1$ to $20_8$ are disposed, and bit lines $BL_1$ to $BL_8$ are connected to the reference layers 23 of the MTJ elements $20_1$ to $20_8$. The bit lines $BL_1$ to $BL_8$ are connected to the control circuit 120 shown in FIG. 1. FIG. 14B shows that two memory cells share the bit lines $BL_1$ to $BL_8$. FIG. 14A is a cross-sectional view of one of these memory cells.

The transistor 31 is disposed on a semiconductor layer 4a, and the transistor 32 is disposed on a semiconductor layer 4b. One of source and drain of the transistor 31 is connected to the conductive layer 12 via a plug 5a, and the other is connected to a word line WL1 via a plug 6a. One of source and drain of the transistor 32 is connected to the conductive layer 12 via a plug 5b, and the other is connected to a word line WL2 via a plug 6b.

The magnetic memory according to the first modification may be highly integrated in the following manner. If the MTJ element is of in-plane magnetization type, the foot print (cell size) per bit may be expressed as $(1+1)F\times(2.5+1)F=7F^2$ where the aspect ratio is set to be 2.5, and the short side width is denoted by F. If the MTJ element is of perpendicular magnetization type, the foot print (cell size) per bit may be expressed as $(1+1)F\times(1+1)F=4F^2$ where the aspect ratio is set to be 1, the short side width is denoted by F.

Figure 14C:
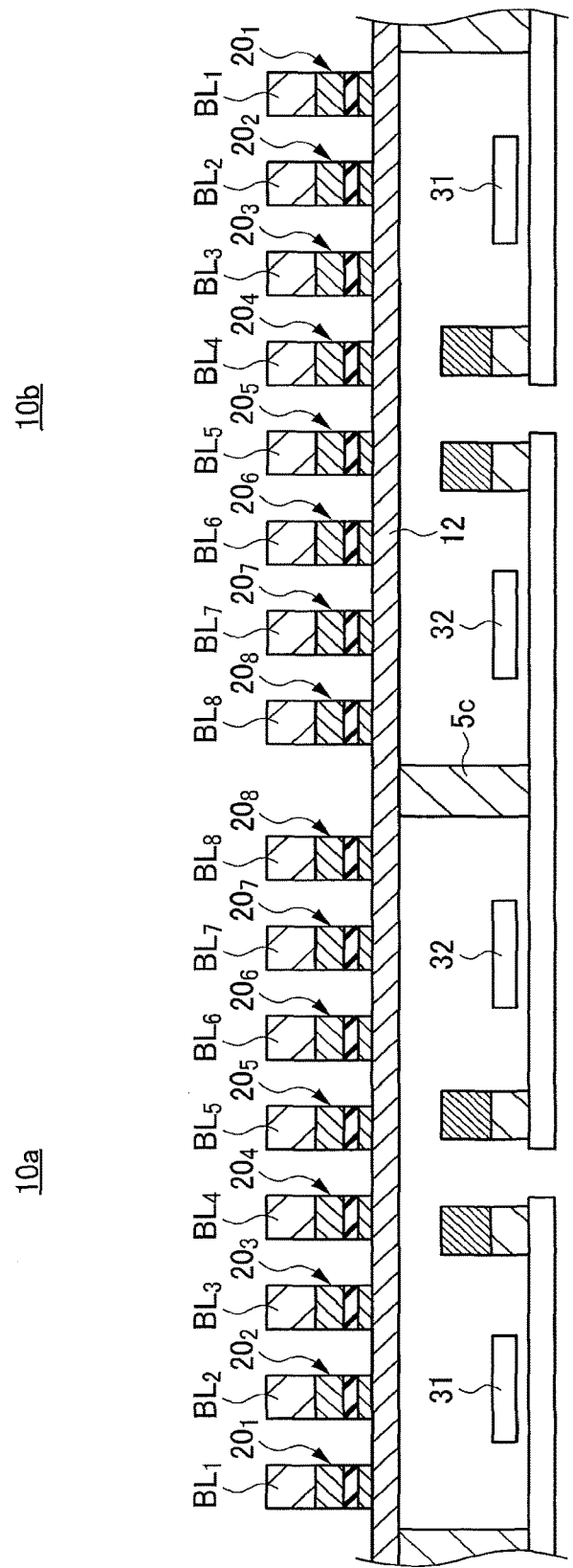
FIG. 14C is a cross-sectional view illustrating the magnetic memory-cells according to the first modification of the first embodiment.

The integration of the magnetic memory may be further improved by adopting the configuration shown in FIG. 14C. In FIG. 14C, adjacent memory cells share the conductive layer 12, and also the plug connecting one of the source and the drain of the transistor 32 and the conductive layer 12 (plug 5c). The adjacent memory cells may share the plug connecting one of the source and the drain of the transistor 31 and the conductive layer 12. With the configuration shown in FIG. 14C, the MTJ elements are disposed in a constant pitch over a broad area. This may improve the patterning accuracy.

(Second Modification)

Figure 15A:
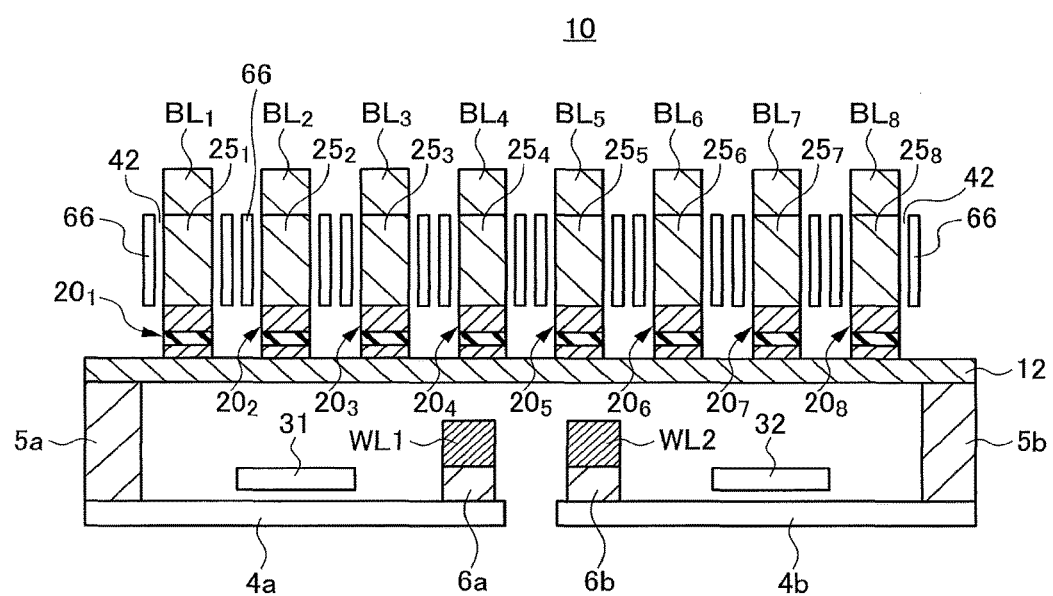
FIG. 15A is a cross-sectional view illustrating a unit string of a magnetic memory-cell according to a second modification of the first embodiment.
Figure 15B:
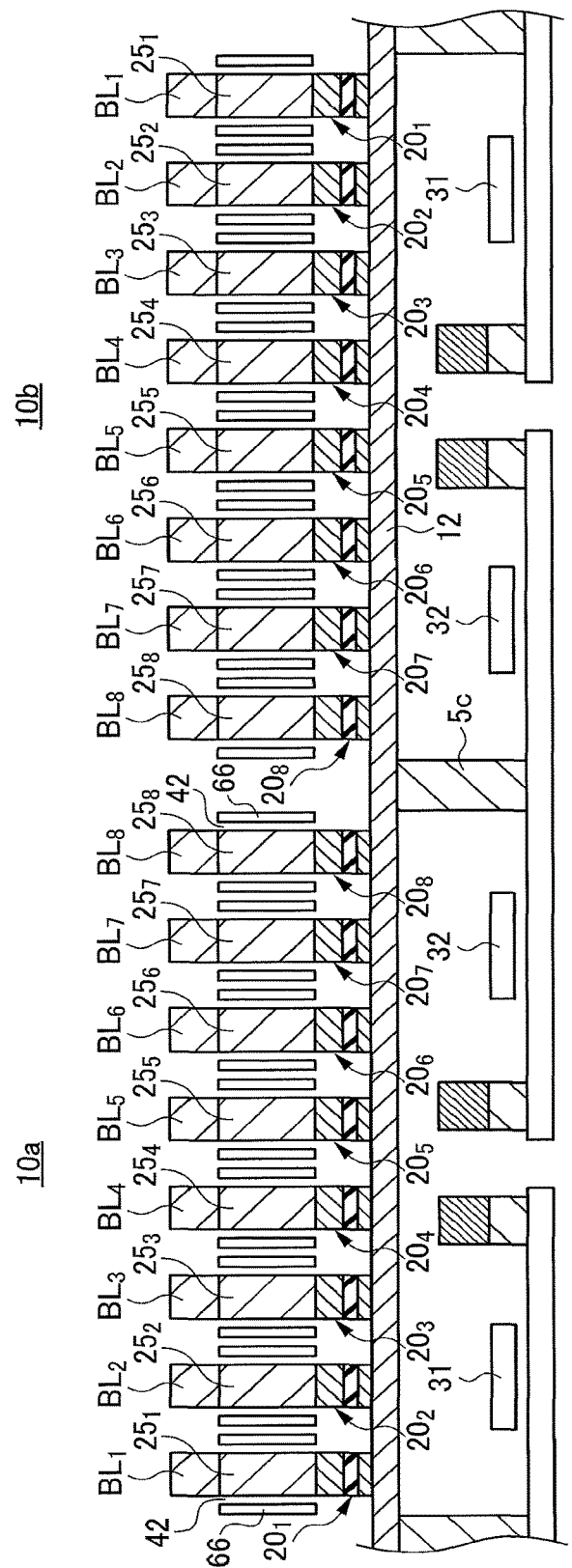
FIG. 15B is a cross-sectional view illustrating a magnetic memory-cells according to the second modification of the first embodiment.

A magnetic memory according to a second modification of the first embodiment will be described with reference to FIGS. 15A and 15B. FIG. 15A is a cross-sectional view of a memory cell of the magnetic memory according to the second modification. The memory cell 10 according to the second modification has a configuration in which a bit selection transistor $25_i$ is disposed between a. MTJ element $20_i$ (i=1, . . . , 8) and a bit line $BL_i$ in the memory cell according to the first modification shown in FIG. 14A. In FIG. 15A, a gate 66 of each transistor $25_i$ (i=1, . . . , 8) is disposed on a side of the transistor, and a gate insulating film 42 is disposed between the side of the transistor and the gate 66. Thus, these transistors are of vertical type.

Like the magnetic memory according to the first modification, the magnetic memory according to the second modification may be highly integrated. A configuration shown in FIG. 15B may further improve the integration. FIG. 15B shows a configuration in which a bit selection transistor $25_i$ is disposed between an MTJ element $20_i$ (i=1, . . . , 8) and a bit line $BL_i$ in the memory cell according to the first modification shown in FIG. 14C. Adjacent two memory cells, each being the one shown in FIG. 15A, share the conductive layer 12, and a plug (plug $5c$) connecting one of the source and the drain of the transistor 32 and the conductive layer 12.

In the first modification and the second modification, the transistors 31 and 32 may be monocrystalline transistors or vertical transistors.

As described above, the magnetic memories according to the first embodiment and its modifications are capable of reducing energy consumption, and being highly integrated.

Second Embodiment

If the MTJ elements $20_2$, $20_3$, and $20_8$ of the memory cell $10_{12}$ in the magnetic memory shown in FIGS. 4 and 5 are selected, the MTJ elements $20_1$ and $20_4$ to $20_7$ of the memory cell $10_{12}$ become byte-half-selected bits, and the MTJ elements $20_2$, $20_3$, and $20_8$ of the memory cell $10_{22}$ become bit-half-selected bits. If these two types of half-section bits are too many and cause fluctuations in threshold value of the critical current for magnetization reversal, for example, erroneous writing may occur. In order to solve this problem, a magnetic memory according to a second embodiment, in which the number of half-selected bits is reduced to substantially solve the problem of erroneous writing, is proposed.

Figure 6:
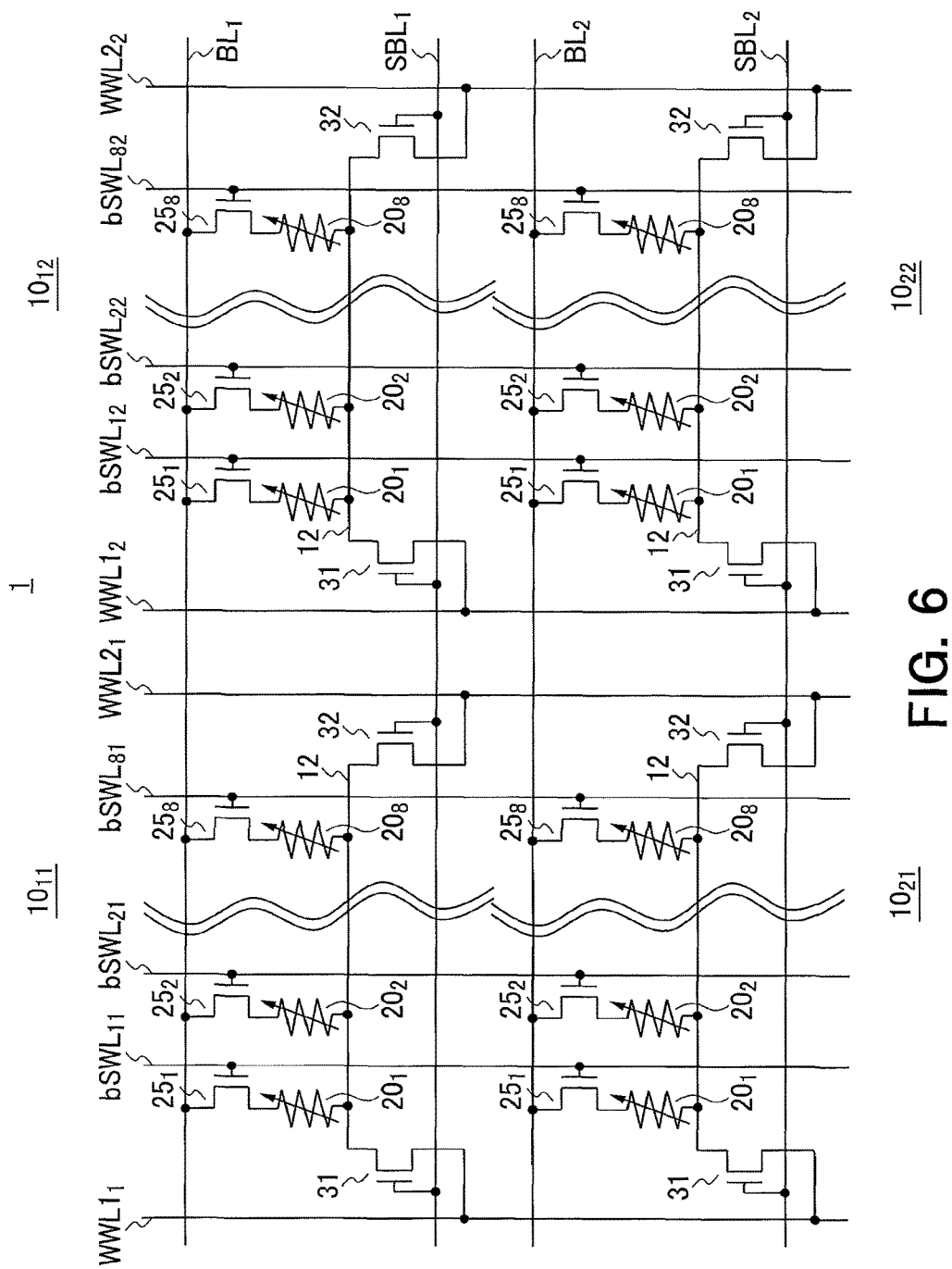
FIG. 6 is a circuit diagram of a magnetic memory according to a second embodiment.

FIG. 6 shows a magnetic memory according to a second embodiment. The magnetic memory 1 according to the second embodiment includes memory cells $10_{11}$ to $10_{22}$ arranged in a 2×2 array. Each memory cell $10_{ij}$ (i, j=1, 2) has the same configuration as the memory cell 10 shown in FIG. 1.

In the memory cells $10_{i1}$ and $10_{i2}$ in the i-th row (i=1, 2), the control terminals of the byte selection transistors 31 and 32 are connected to a byte selection bit line $SBL_i$.

In the memory cells $10_{1j}$ and $10_{2j}$ in the j-th column (j=1, 2), the second terminals of the byte selection transistors 31 are connected to a first writing word line $WWL1_j$, and the second terminals of the byte selection transistors 32 are connected to a second writing word line $WWL2_j$.

In each memory cell $10_{ij}$ (i, j=1, 2), the control terminal of the bit selection transistor $25_k$ (k=1, . . . , 8) is connected to a bit selection word line $bSWL_{kj}$, and the second terminal is connected to a common bit line $BL_i$.

A write operation is performed in the following manner in the magnetic memory according to the second embodiment.

If a memory cell is selected and data is written to one or more MTJ elements of the selected memory cell (selected byte) in the second embodiment, corresponding ones of the bit selection transistors $25_1$ to $25_8$ are turned ON to bring the target MTJ elements into a half-selection state, and the byte selection transistor 31 and the byte selection transistor 32 of the selected memory cell are turned ON to cause a current to flow through the conductive layer 12, thereby writing data to the half-selected MTJ elements.

In a read operation, a memory cell from which data is read is selected, one or more of the bit selection transistors $25_1$ to $25_8$ in the selected memory cell corresponding to MTJ elements from which data is read are turned ON, and at least one of the byte selection transistor 31 and the byte selection transistor 32 are turned ON to cause a current to flow through the MTJ elements from which data is read, thereby reading data stored in the MTJ elements.

Although the bits are selected to be brought into the half-selection state, the bits may be selected to increase the uniaxial magnetic anisotropy so that data may not to be written to the bits easily. In this case, data is written to the non-selected bits.

The magnetic memory according to the second embodiment is capable of reducing energy consumption and being highly integrated, like the magnetic memories according to the first embodiment.

Third Embodiment

Figure 7:
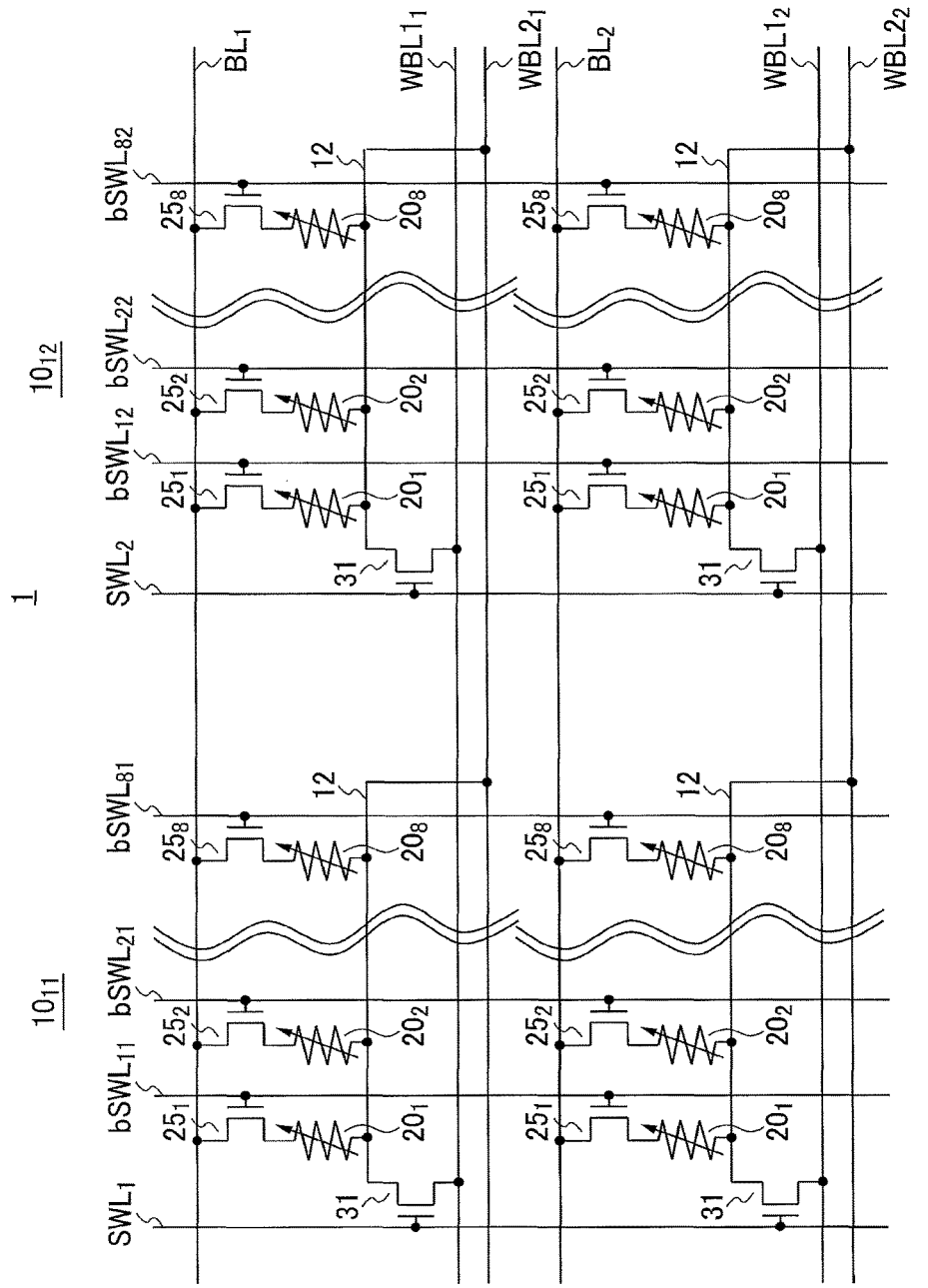
FIG. 7 is a circuit diagram of a magnetic memory according to a third embodiment.

FIG. 7 shows a magnetic memory according to a third embodiment. The magnetic memory 1 according to the third embodiment includes memory cells $10_{11}$ to $10_{22}$ disposed in a 2×2 array. Each memory cell $10_{ij}$ (i, j=1, 2) has a configuration in which the byte selection transistor 32 is removed from the memory cell 10 shown in FIG. 1.

In the memory cells $10_{i1}$ and $10_{i2}$ in the i-th (i=1, 2) row, the second terminals of the byte selection transistors 31 are connected to a first writing bit line $WBL1_i$, and the second terminals of the conductive layers 12 are connected to a second writing bit line $WBL2_i$.

In the memory cells $10_{1j}$ and $10_{2j}$ of the j-th column (j=1, 2), the control terminals of the byte selection transistors 31 are connected to a byte selection word line $SWL_j$.

In each memory cell $10_{ij}$ (i, j=1, 2), the control terminals of the bit selection transistors $25_k$ (k=1, . . . , 8) are connected to a bit selection word line $bSWL_{kj}$, and the second terminals are connected to a bit line $BL_i$.

The read operation and the write operation for the magnetic memory according to the third embodiment are the same as those for the magnetic memory according to the second embodiment. In third embodiment, the write operation and the read operation may be performed with the single byte selection transistor 31. However, a byte selection transistor 32 and a wiring line connected to the control terminal of the byte selection transistor 32 may be disposed on the opposite side of the conductive layer 12 to the byte selection transistor 31, as in the second embodiment show in FIG. 5.

The magnetic memory according to the third embodiment is capable of reducing energy consumption, like the magnetic memory according to the second embodiment.

Fourth Embodiment

Figure 8:
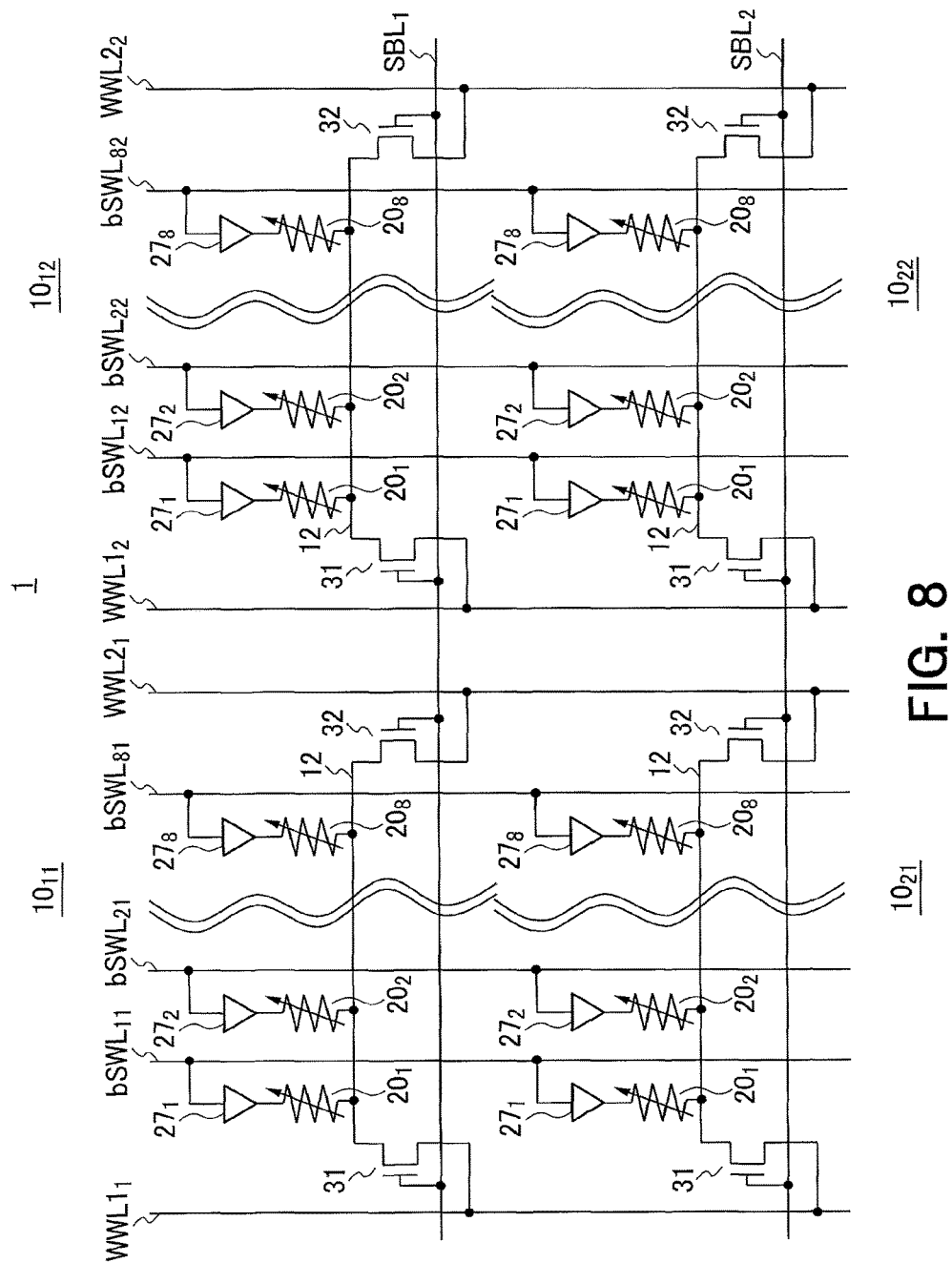
FIG. 8 is a circuit diagram of a magnetic memory according to a fourth embodiment.

FIG. 8 shows a magnetic memory according to a fourth embodiment. The magnetic memory 1 according to the fourth embodiment includes memory cells $10_{11}$ to $10_{22}$ arranged in a 2×2 array. Each memory cell $10_{ij}$ (i, j=1, 2) includes diodes $27_1$ to $27_8$ instead of the bit selection transistors $25_1$ to $25_8$ in the memory cell 10 shown in FIG. 1. The cathode of each diode $27_i$ (i=1, ..., 8) is connected to the second terminal of a corresponding MTJ element $20_i$.

In the memory cells $10_{i1}$ and $10_{i2}$ in the i-th row (i=1, 2), the control terminals of the byte selection transistors 31 and 32 are connected to a byte selection bit line $SBL_i$.

In the memory cells $10_{1j}$ and $10_{2j}$ in the j-th column (j=1, 2), the second terminals of the byte selection transistors 31 are connected to a first writing word line $WWL1_j$, and the second terminals of the byte selection transistors 32 are connected to a second writing word line $WWL2_3$.

In each memory cell $10_{ij}$ (i, j=1, 2), the anode of the diode $27_k$ (k=1, ..., 8) is connected to a bit selection word line $bSWL_{kj}$.

A write operation for the magnetic memory 1 according to the fourth embodiment will be described below.

Data is written to the magnetic memory 1 according to the fourth embodiment by selecting a memory cell, selecting one or more MTJ elements of the selected memory cell (selected byte), applying a voltage to one or more bit selection word lines connected to the selected MTJ elements to bring the selected MTJ elements into a half-selection state, and turning ON the byte selection transistor 31 and the byte selection transistor 32 to cause a current to flow through the conductive layer 12 to write data to the half-selected MTJ elements.

Although the bits are selected to be brought into the half-selection state, the bits may be selected to improve the uniaxial magnetic anisotropy so that data may not be written to the bits easily. In this case, data is written to the non-selected bits.

In a read operation, a voltage is applied to the bit selection word line connected to the MTJ element from which data is to be read, and at least one of the byte selection transistor 31 and the byte selection transistor 32 are turned ON. As a result, a current flows through the MTJ element from which data is to be read to enable data to be read from the MTJ element. The diode connected to each MTJ element prevents the read current from flowing to other MTJ elements, thereby considerably improving the signal-to-noise ratio of the read signal.

In the fourth embodiment, a plurality of MTJ elements may be connected to the two byte selection transistors 31 and 32. FIG. 8 shows that eight MTJ elements $20_1$ to $20_8$ are connected to the two byte selection transistors 31 and 32. A perpendicular magnetization MTJ element may be formed with a $4F^2$ foot print, where F denotes the design rule. The foot print of the eight MTJ element is $32F^2$. Since a common transistor may be formed with a foot print of $6F^2$, two transistors may be formed under the eight MTJ elements. Therefore, the foot print for 1 bit may be set to be $4F^2$.

Although the cathode of each diode $27_i$ (i=1, ..., 8) is connected to the second terminal of the corresponding MTJ element $20_i$ in the fourth embodiment, it may be the anode that is connected to the second terminal of the corresponding MTJ element $20_i$.

The magnetic memory according to the fourth embodiment is capable of reducing energy consumption, like the magnetic memory according to the first embodiment.

Fifth Embodiment

In the magnetic memory 1 according to the fourth embodiment, the MTJ elements connected to a common bit line are brought into the half-selection state, like the magnetic memory according to the first embodiment shown in FIG. 4. Therefore, erroneous writing may occur. A magnetic memory having an array configuration in which the number of half-selected bits is reduced to substantially solve the problem of erroneous writing will be described below as a fifth embodiment.

Figure 9:
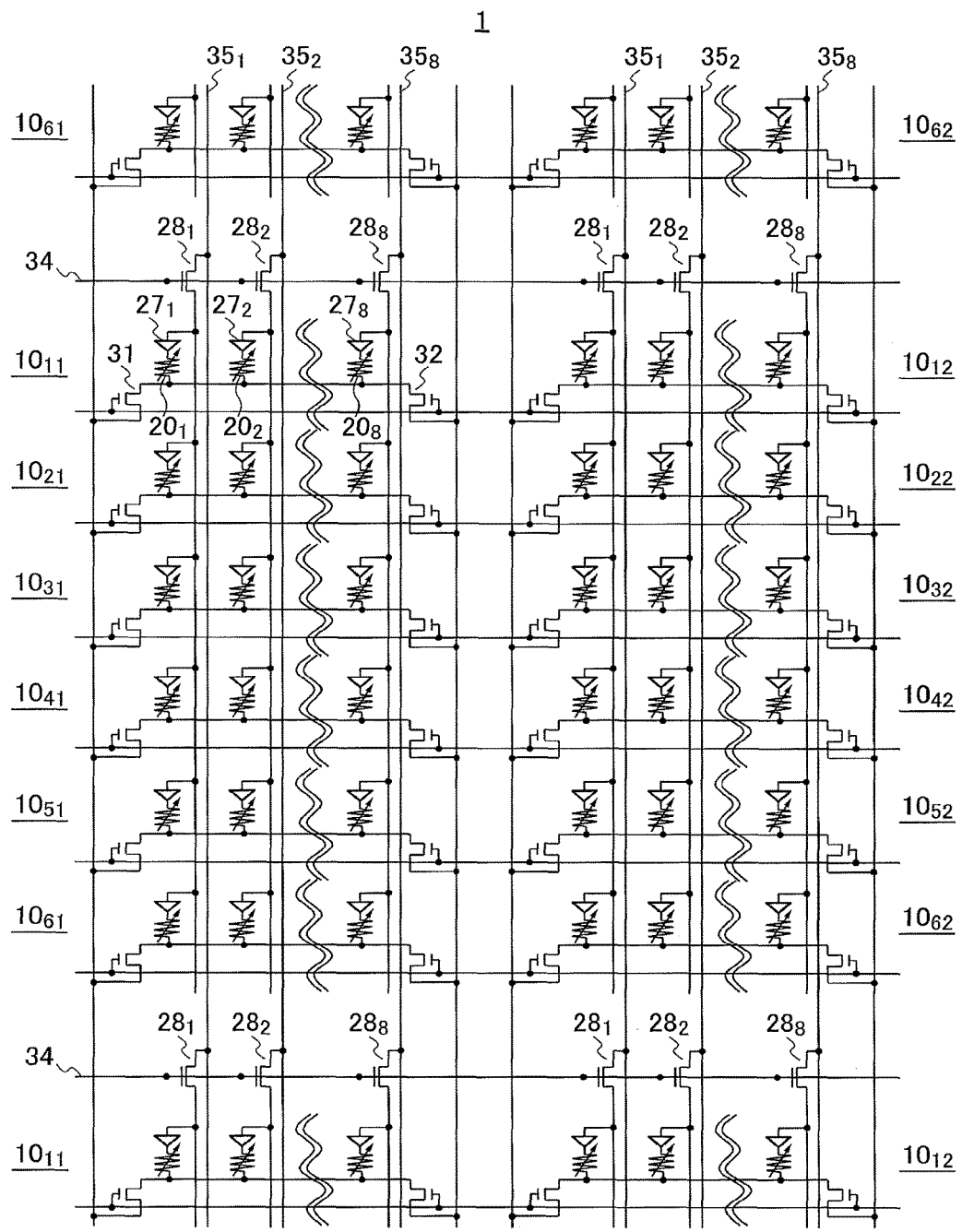
FIG. 9 is a circuit diagram of a magnetic memory according to a fifth embodiment.

FIG. 9 shows a magnetic memory according to the fifth embodiment. In the magnetic memory 1 according to the fifth embodiment, a plurality of cell groups are arranged in the column direction, each cell group having a configuration in which memory cells, each being the memory cell of the magnetic memory according to the fourth embodiment, are arranged in six rows and two columns. Transistors $28_1$ to $28_8$ are disposed between adjacent cell groups. With this configuration, the number of MTJ elements connected to a single bit line may be reduced. As a result, the number of half-selected bits may be reduced, erroneous writing may be prevented.

Each cell group shown in FIG. 9 has memory cells $10_{11}$ to $10_{62}$ arranged in six rows and two columns. Each memory cell $10_{ij}$ (i=1, ..., 6, j=1, 2) has the same configuration as the memory cell of the magnetic memory 1 according to the fourth embodiment.

The gate (control terminal) of each of the transistors $28_1$ to $28_8$ disposed on the same row is connected to a wiring line 34, one of the source and the drain (first terminal) is connected to a corresponding one of bit selection word lines (see FIG. 8), and the other (second terminal) is connected to a corresponding one of wiring lines $35_1$ to $35_8$.

Although each cell group includes the memory cells arranged in the same number of rows in FIG. 9, the number of rows may differ.

The magnetic memory according to the fifth embodiment is capable of reducing energy consumption, like the magnetic memory according to the fourth embodiment.

Sixth Embodiment

Figure 10:
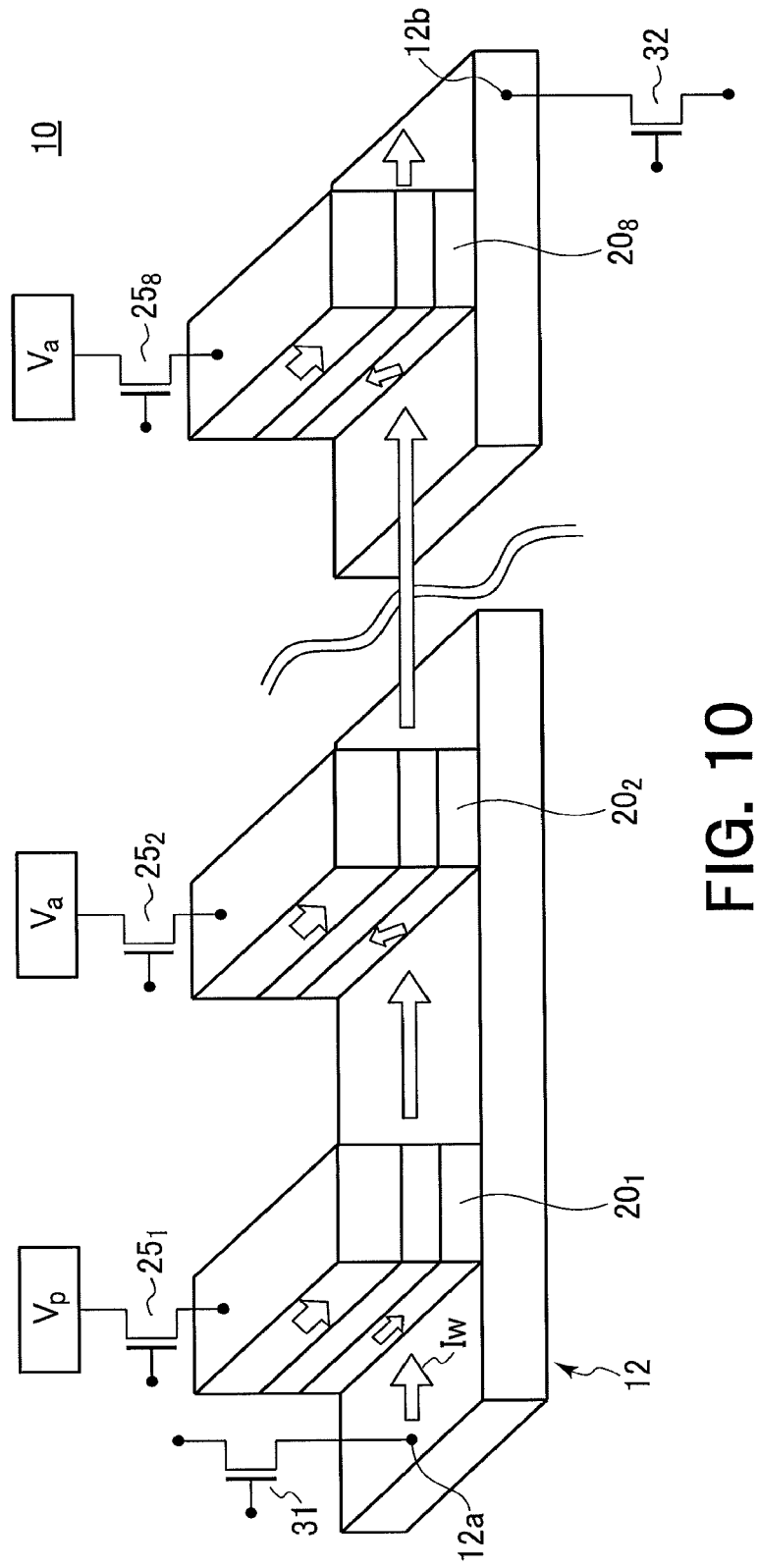
FIG. 10 is a diagram illustrating a write method for a magnetic memory according to a sixth embodiment.

A magnetic memory according to a sixth embodiment will be described with reference to FIG. 10. The magnetic memory 1 according to the sixth embodiment has the same configuration as the magnetic memory 1 according to the first embodiment shown in FIG. 1, but a method of writing data to the magnetic memory 1 according to the sixth embodiment is different.

The write method is performed in two stages, like that of the first embodiment. First, two potentials are applied to the bits to be selected to distinguish easy-to-write bits and difficult-to-write bits. The number of MTJ elements connected to the bit line is reduced. For example, a positive potential Va is applied to the bits (MTJ elements) $20_2$ to $20_8$ to be activated via the corresponding bit line selection transistors $25_2$ to $25_8$, and a negative potential Vp is applied to the bit (MTJ element) $20_1$ not to be activated via the corresponding bit line selection transistor $25_1$, as shown in FIG. 10. At the same time, a write current is caused to flow through the conductive layer 12 from the first terminal 12a to the second terminal 12b, for example. As a result, data "0" is written to the bits (MTJ elements) $20_2$ to $20_8$ to be activated. Subsequently, the positive potential Va is applied to the MTJ element $20_1$ via the bit line selection transistor $25_1$, and the negative potential Vp is applied to the MTJ elements $20_2$ to $20_8$ via the bit line selection transistors $25_2$ to $25_8$, and a write current is caused to flow through the conductive layer 12 from the second terminal 12b to the first terminal 12a. As a result, data "1" is written to the MTJ element $20_1$. Thus, digital data (1, 0, 0, 0, 0, 0, 0, 0) is written to the memory cell 10.

If the threshold current for bits to be activated is denoted by $I_{cha}$ (=$I_{c0}/2$), and the threshold current for bits not to be activated is denoted by $I_{chp}$, $I_{chp}$ may be expressed by the following formula:

$$I_{chp}=1.5I_{c0} \qquad (6)$$

Therefore, the write current $I_{w0}$ may be expressed by the following formulas:

$$I_{w0} \sim 1.5I_{cha}=0.75I_{c0} \qquad (7)$$

$$I_{w0}=0.5I_{chp} \qquad (8).$$

Thus, the erroneous writing occurrence ratio may be reduced to an ignorable level ($<10^{-9}$).

The write operation in the sixth embodiment is performed by means of the control circuits 110 and 120 shown in FIG. 1, like the first embodiment.

The magnetic memory according to the sixth embodiment is capable of reducing energy consumption, like the magnetic memory according to the first embodiment.

As described above, the two-stage write operation performed for the respective embodiments allows digital data to be written to a plurality of MTJ elements. Therefore, the energy required for the write operation may be reduced by nearly one order of magnitude.

A method of further improving write error rate (WER) will be described below.

The write probability $P_{sw}$ in a single write operation may be approximated in the following manner (see Springer Science+Business Media Dordrecht 2013, Yongbing Xu, David D. Awshalom and Junsaku Nitta, Handbook of Spintronics 10.1007/978-94-007-76004-3_39-1).

$$P_{SW} = 1 - \exp\left(-t_p f_0 \exp\left(-\Delta_{sw}\left(1-\frac{I_W}{I_{c0}}\right)^x\right)\right)$$

Therefore, the no-write probability $Pn_{SW}$ may be obtained by $1-P_{SW}$.

In the above formula, $f_0$ is the attempt frequency, which generally is considered to be about $1\times10^9$ Hz, $t_p$ is write pulse width, $I_w$ is write current, and $I_{c0}$ is switching current value (write probability 50%) interpolated into write pulse width $t_p$=1 ns, and $\Delta_{SW}$ is indicator of thermal stability which is expressed as $\Delta_{SW}=(\Delta E_{SW}/(k_B T))$ where $\Delta E_{SW}$ is switching energy, $k_B$ is Boltzmann constant, and T is absolute temperature. Also in the above formula, x is a value in a range from 1 to 2, which is determined by the magnetic memory.

A first method for improving the write error rate WER is to increase the write pulse width $t_p$. In an ideal bit (memory element, or MTJ element), an increase in the write pulse width $t_p$ would lead to an increase in the switching current value $I_{c0}$. Therefore, if the pulse width $t_p$ increases, the no-write probability $Pn_{SW}$ may decrease according to the above formula.

In application to storage class memories, the write pulse width $t_p$ may be increased to about 200 ns. The write pulse $t_p$ may be applied a plurality of times to have the same effect as the increase in the write pulse $t_p$.

If the write probability of a selected bit by a write pulse width $t_p$ during one operation is denoted by $P_{sw}$, and the no-write probability of a non-selected bit is denoted by $Pn_{sw}$, the probability of not writing to the selected bit after a write pulse having a width $2t_p$ is applied or a write pulse having a width $t_p$ is applied two times is $(1-PS_{sw})^2$, and the no-write probability of the non-selected bit is about $2Pn_{sw}$. If, for example, $(1-PS_{sw})$ is set to be $1\times10^{-6}$, and $Pn_{SW}$ is set to be $1\times10^{-11}$, the write probability of a selected bit after a write pulse having a width $2t_p$ is applied or a write pulse having a width $t_p$ is applied twice is about $1\times10^{-12}$, and the no-write probability of a non-selected bit $2Pn_{SW}$ is $2\times10^{-11}$. Thus, the application of the write pulse considerably improves the write probability of the selected bit or the no-write probability of the non-selected bit. As a result, the write error rate WER becomes on the order of $1\times10^{-11}$.

In the above example, the write current $I_{w0}$ is reduced by applying a voltage to activate bits. A method of reducing the switching current value $I_{c0}$ itself in an in-plane magnetization MTJ element will be described below.

As described above, the switching current value $I_{c0}$ is proportional to the uniaxial magnetic anisotropy of the storage layer, more accurately to the uniaxial magnetic anisotropy energy $\Delta E_{ret}$. The switching current value $I_{c0}$ is also proportional to the switching energy $\Delta E_{sw}$. Therefore, the switching current value $I_{c0}$ may be expressed as follows:

$$I_{c0}=4e\alpha/\hbar\theta_{SH}(\Delta E_{ret}+\Delta E_{sw})t_{be}w_{be}/ARw_{si}^2 \qquad (9)$$

where e is electron charge, $\alpha$ is damping constant, h is reduced Planck constant, $\theta_{SH}$ is spin transfer efficiency, $\Delta E_{ret}$ is uniaxial magnetic anisotropy energy (retention energy), $\Delta E_{sw}$ is switching energy, AR is aspect ratio of the storage layer (MTJ element), $t_{be}$ is thickness of the conductive layer, $w_{be}$ is width of conductive layer, $t_{si}$ is thickness of the storage layer, and $w_{si}$ is the width of the storage layer.

The switching energy $\Delta Esw$ is demagnetization field energy in the vertical direction of the storage layer. If a certain degree of perpendicular magnetic anisotropy is applied to the storage layer, the uniaxial magnetic anisotropy energy $\Delta E_{ret}$ may be maintained, or actually prevented from decreasing, and the switching current value $I_{c0}$ may be reduced.

Figure 16:
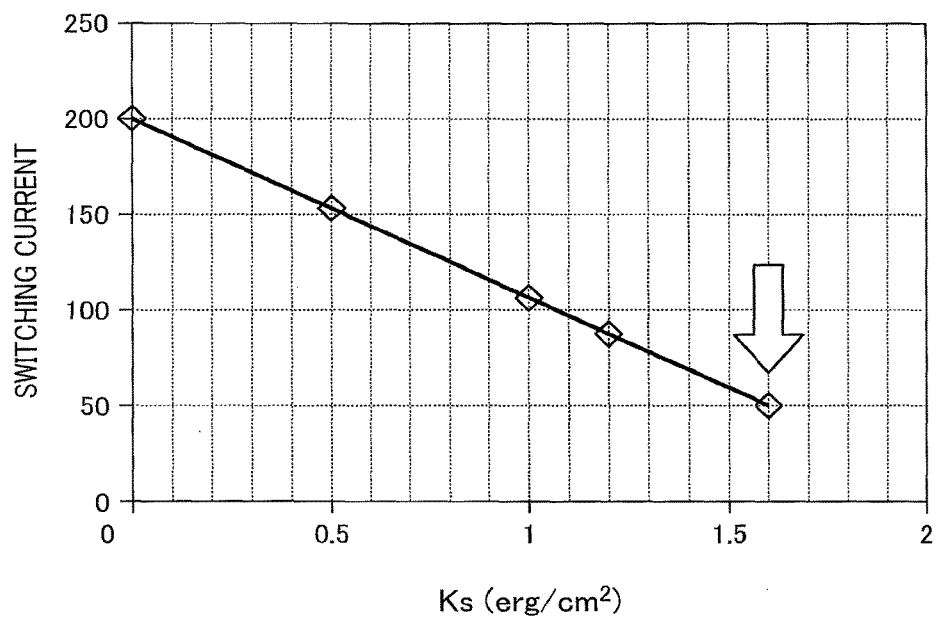
FIG. 16 is a diagram showing a relationship between interface magnetic anisotropy (Ks) generated at an interface between a storage layer and a tunnel barrier and switching current value $I_{c0}$.

FIG. 16 shows a calculation result of this effect. FIG. 16 illustrates the relationship between the interface magnetic anisotropy (Ks) between the storage layer and the tunnel barrier and the switching current value $I_{c0}$. As shown by an arrow in FIG. 16, the switching current value $I_{c0}$ may be reduced to one fourth by setting the interface magnetic anisotropy Ks to be about 1.6 erg/cm². In this calculation, the damping constant $\alpha$ is set to be 0.01.

EXAMPLES

In the magnetic memories according to the first to sixth embodiments and their modifications, bits (MTJ elements) are closely arranged. Therefore, miniaturization of the magnetic memories may lead to interaction between bits. Examples of magnetic memories in which interaction between bits is reduced and stable memory operation is secured will be described below.

First Example

Figure 17:
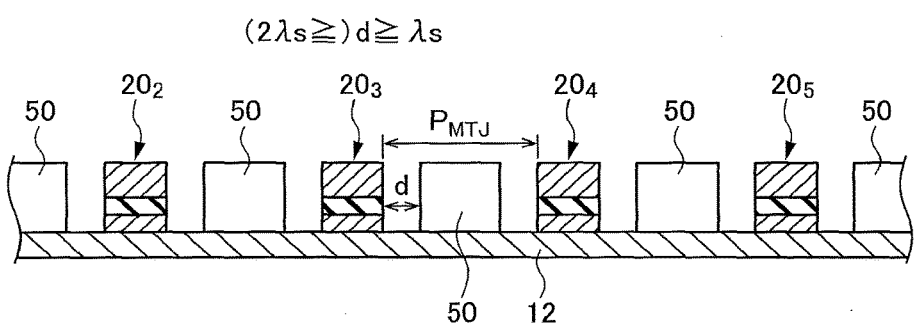
FIG. 17 is a cross-sectional view of a first example of a magnetic memory.

A first example of the magnetic memory will be described with reference to FIG. 17. FIG. 17 is a cross-sectional view of the first example, in which the distance $P_{MTJ}$ between bits is increased so that magnetic flux from a storage layer does not reach adjacent bits. The increase in the distance $P_{MTJ}$ between bits may lead to an increase in the resistance of the conductive layer 12 and may cause problems. Therefore, the thickness of the conductive layer 12 between bits is increased to suppress the increase in resistance of the conductive layer 12. Specifically, a layer 50 of a material having a large conductivity is disposed between adjacent MTJ elements $20_i$ and $20_{i+1}$ (i=1, ..., 8). The layer 50 may be formed of such a material as Ta, W, or Cu.

If the distance between bits is not increased, the existence of the layer 50 between bits to increase the thickness of the conductive layer 12 and thereby to suppress the increase in the resistance of the conductive layer 12 would prevent an adverse effect of a voltage effect and to lower energy consumption further.

In the first example, the distance d between the MTJ element and the thick conductive layer 50 is preferably set to be d≥λs to prevent an increase in the threshold current $I_{c0}$, where λs is spin diffusion length in the conductive layer 12, which is generally about 0.5 nm to 1 nm. The distance d is preferably set as follows in order not to increase the resistance of the conductive layer 12:

2λs>d≥λs.

Figure 18:
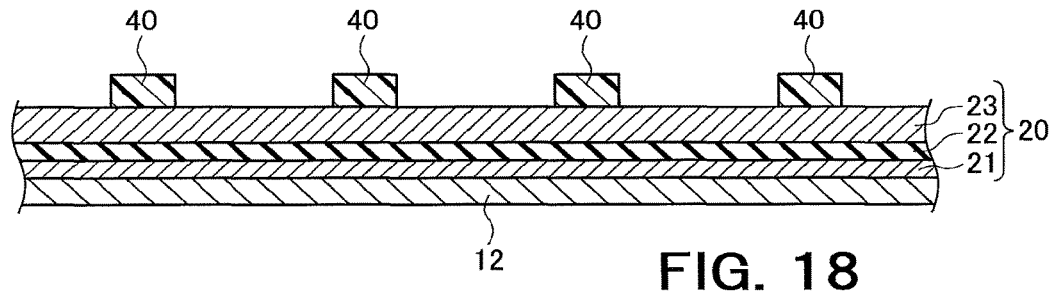
FIGS. 18 to 21 are cross-sectional views illustrating a method of manufacturing the first example of the magnetic memory.

FIGS. 18 to 21 show a method of manufacturing the first example of the magnetic memory. First, a magnetic layer to become the storage layer 21, a nonmagnetic layer 22, and a magnetic layer to become the reference layer 23 are sequentially disposed on the conductive layer 12. A mask 40 for patterning the MTJ element is disposed on the magnetic layer 23 (FIG. 18).

Figure 19:
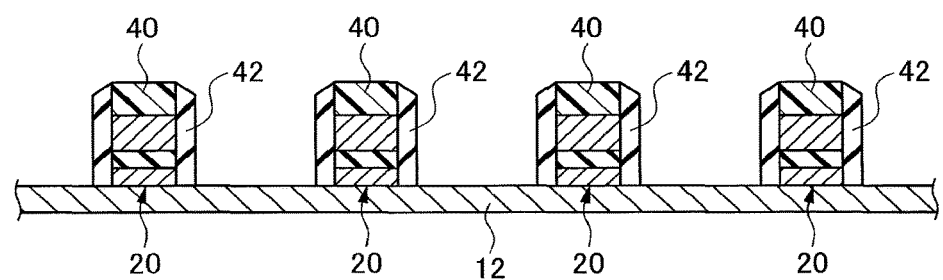

The magnetic layer 23, the nonmagnetic layer 22, and the magnetic layer 21 are patterned using the mask 40 to obtain the MTJ element 20. Thereafter, sidewalls 42 of an insulating material are disposed on sides of the MTJ element 20 (FIG. 19). The thickness of the sidewalls 42 corresponds to the distance D between the MTJ element 20 and the thick layer 50.

Figure 20:
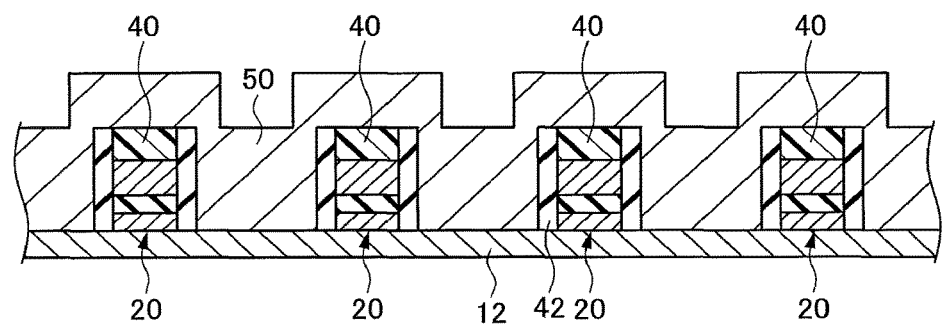
Figure 21:
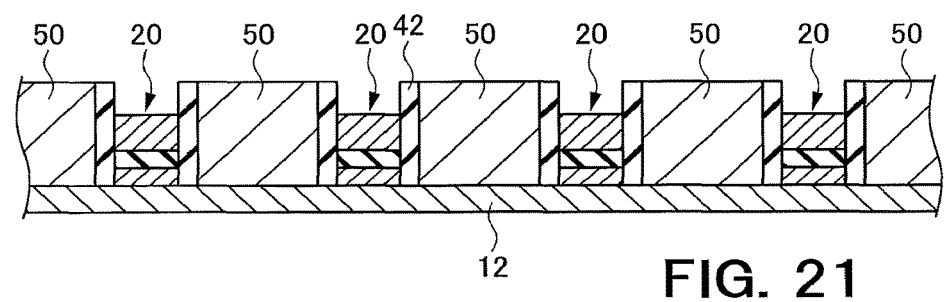

Subsequently, the layer 50 of a material having a large conductivity is disposed, as shown in FIG. 20. The layer 50 is etched until the top surfaces of the sidewalls 42 are exposed. The direction of the depth of the MTJ element 20 and the layer 50 is defined, and the workpiece is processed. The mask 40 is removed to complete the memory cell of the magnetic memory (FIG. 21).

According to this manufacturing method, the conductive layer 50 between bits may be formed in a self-alignment process. Therefore, the thickness of the conductive layer between bits may be increased even if the distance between bits is not increased. This is especially effective in the application to storage class memories in which many bits are disposed on a single conductive layer.

Figure 22:
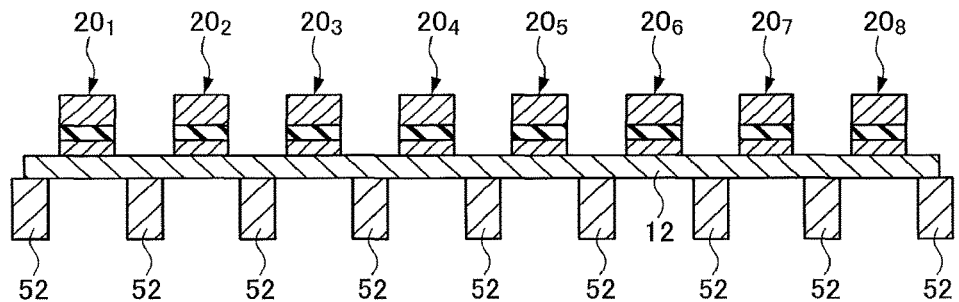
FIG. 22 is a cross-sectional view illustrating the magnetic memory according to the first example.

An increase in the resistance of the conductive layer may also be prevented by disposing conductors 52 such as vias below the conductive layer 12 to increase the thickness of the conductive layer between bits, as shown in FIG. 22. If the conductors 52 are formed in the same process as that for forming vias at both ends of the memory cells, i.e., the plugs shown in FIG. 14A, the costs may not be increased by forming the conductors 52.

Second Example

Figure 23:
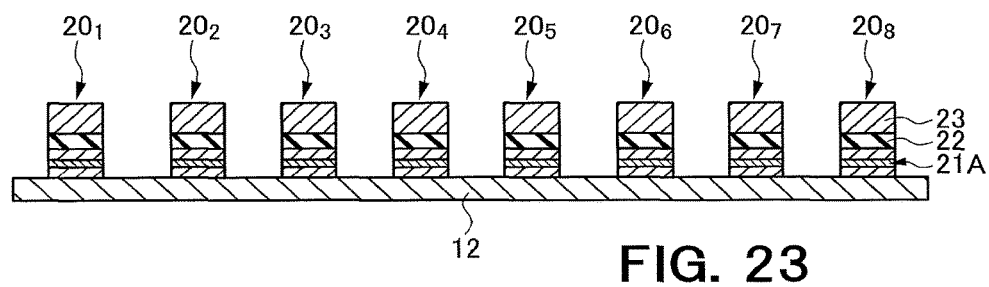
FIG. 23 is a cross-sectional view illustrating a second example of a magnetic memory.

A second example of the magnetic memory includes a synthetic storage layer 21A having, for example, a CoFeB/Ru/CoFeB structure as the storage layer 21 of the MTJ element serving as a memory element (FIG. 23). This structure may reduce the leakage magnetic flux from the storage layer 21A. Therefore, the interaction between storage layers of adjacent MTJ elements may be reduced even if the distance between bits is short.

Third Example

Figure 24:
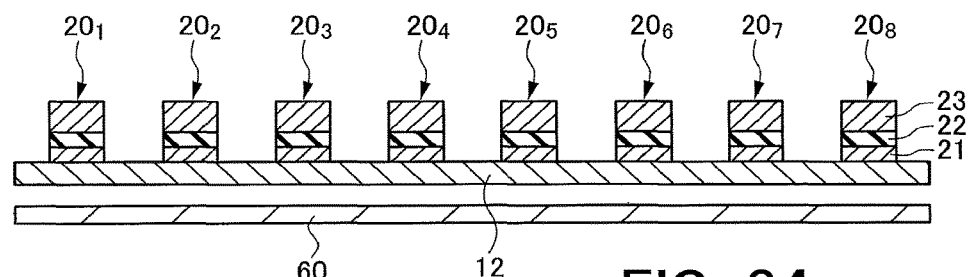
FIG. 24 is a cross-sectional view illustrating a third example of a magnetic memory.

A third example of the magnetic memory has a structure in which a soft magnetic layer 60 of, for example, NiFe or CoFeB is disposed under the conductive layer 12 in each memory cell of the magnetic memory according to the first to sixth embodiments, as shown in FIG. 24. The leakage magnetic flux from the storage layer may be sucked by the soft magnetic layer 60. Therefore, the interaction between storage layers of adjacent MTJ elements may be reduced with the distance between bits being maintained to be short, and the retention energy of the storage layers may be increased.

Fourth Example

Figure 25:
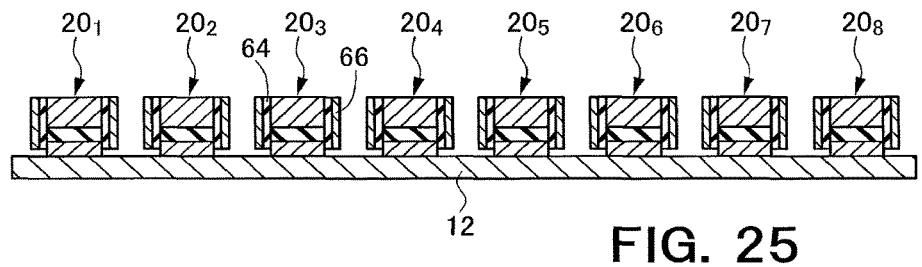
FIG. 25 is a cross-sectional view of a fourth example of a magnetic memory.

A fourth example of the magnetic memory has a structure in which a soft magnetic layer 66 is disposed around each of the MTJ elements $20_1$ to $20_8$ via an insulating layer 64, as shown in FIG. 25. The leakage magnetic flux from the storage layer may be sucked by the soft magnetic layer 66. Therefore, the interaction between storage layers of adjacent MTJ elements may be reduced with the distance between bits being maintained to be short, and the retention energy of the storage layers may be increased. The magnetic thickness (Ms'×t') of the soft magnetic layer 66 in this example is preferably set to be greater than the magnetic thickness (Ms×t) of the storage layer, where Ms is the saturation magnetization of the storage layer, t is the thickness of the storage layer, Ms' is the saturation magnetization of the soft magnetic layer, and t' is the thickness of the soft magnetic layer.

Figure 26:
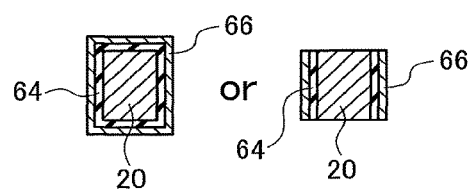
FIG. 26 is a plan view of a memory element of the fourth example of the magnetic memory.

FIG. 26 shows plan views of memory elements (MTJ elements). The soft magnetic layer 66 may be disposed to surround the MTJ element 20 to cover the four sides of the MTJ element 20 as shown in the left drawing, or disposed to cover two opposing sides of the MTJ element 20 as shown in the right drawing.

FIGS. 27 to 30 show a manufacturing method, in which the soft magnetic layer 66 is disposed to cover the two opposing sides of the MTJ element 20.

Figure 27:
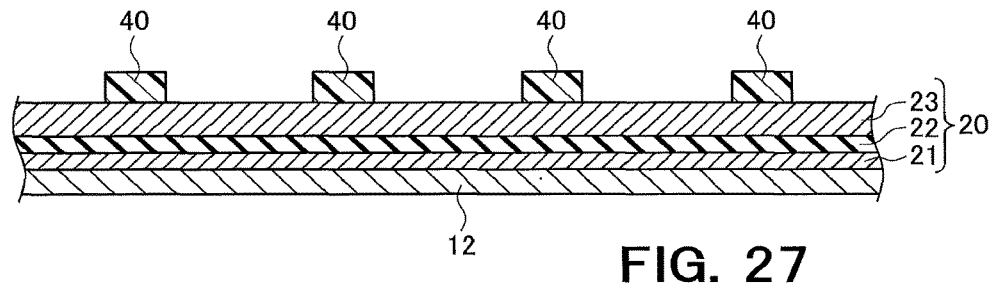
FIGS. 27 to 30 are cross-sectional views illustrating a method of manufacturing the fourth example of the magnetic memory.

First, a magnetic layer to become the storage layer 21, a nonmagnetic layer 22, and a magnetic layer to become the reference layer 23 are sequentially disposed on the conductive layer 12. A mask 40 for patterning the MTJ element is disposed on the magnetic layer 23 (FIG. 27).

Figure 28:
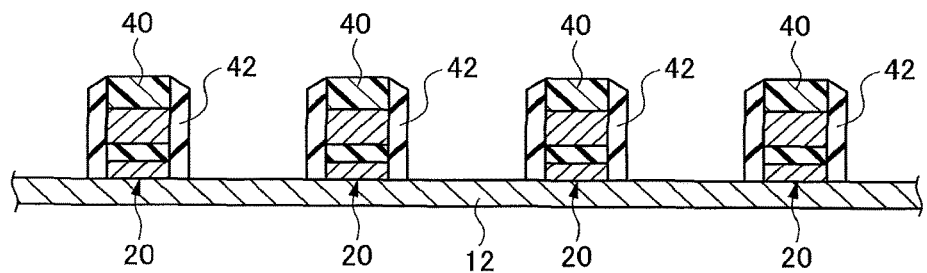

Using the mask 40, the magnetic layer 23, the nonmagnetic layer 22, and the magnetic layer 21 are patterned to form the MTJ element 20. Sidewalls 42 of an insulating material are disposed at sides of the MTJ element 20 (FIG. 28). The thickness of the sidewalls 42 corresponds to the distance D between the MTJ element 20 and the thick layer 50.

Figure 29:
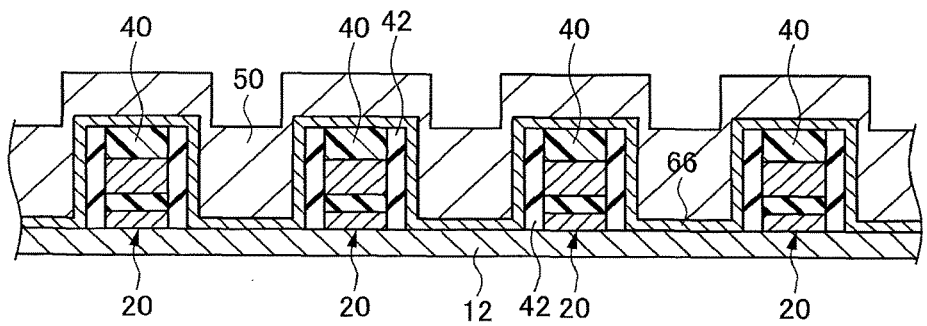
Figure 30:
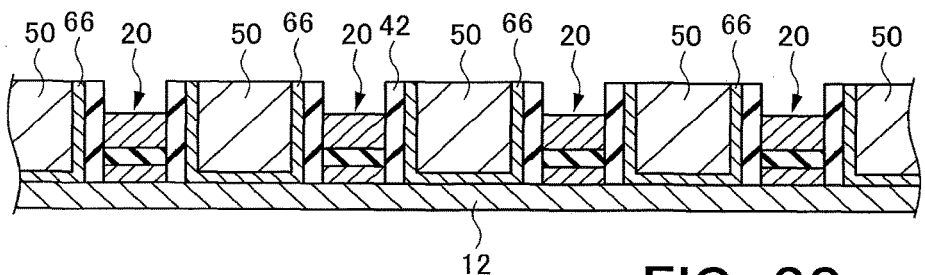

Thereafter, the soft magnetic layer 66 is disposed, and then a layer 50 having a large conductivity is disposed, as shown in FIG. 29. The layer 50 is etched until the top surfaces of the sidewalls 42 are exposed. The direction of the depth of the MTJ element 20 and the layer 50 is defined, and the workpiece is processed. The mask 40 is removed to complete the memory cell of the magnetic memory (FIG. 30). The layer 50 disposed between adjacent bits may be capable of reducing the resistance between the bits.

Data may be written to the magnetic memories of the embodiments even faster in the following manners.

Fifth Example

Figure 31A:
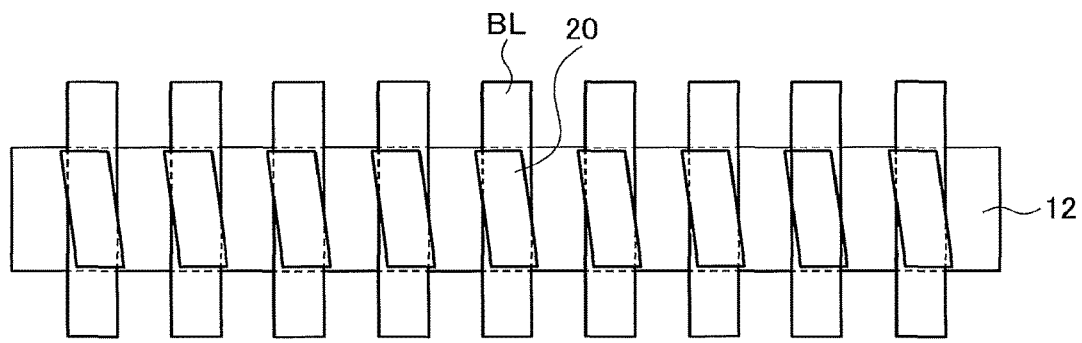
FIG. 31A is a plan view of a fifth example of a magnetic memory.

A fifth example of the magnetic memory will be described with reference to FIGS. 31A and 31B. In this magnetic memory, the MTJ elements 20 are disposed so that an angle between their long sides and the direction in which the conductive layer 12 extends is not 90 degrees. Thus, the long sides are slanted relative to the direction in which the conductive layer 12 extends (FIG. 31A).

In the first to sixth embodiments and the first to fourth examples, the long sides of each MTJ element 20 make an angle of approximately 90 degrees with the direction in which the conductive layer 12 extends. Therefore, when a write current starts to flow, no spin transfer torque acts in principle since the spin of electrons at the surface of the conductive layer 12 is parallel or antiparallel to the magnetization of the storage layer. Actually, however, spin transfer torque caused by fluctuations of magnetization direction weakly acts in the initial state, and a large spin transfer torque acts to complete a write operation after the precession of magnetization becomes sufficiently large.

Figure 31B:
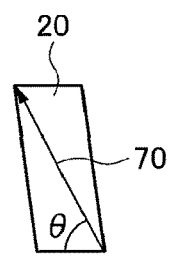
FIG. 31B is a plan view of a memory element of the fifth example of the magnetic memory.

In the sixth example, the magnetization 70 of the storage layer included in the MTJ element is oriented to be along the longest diagonal line, as shown in FIG. 31B. As a result, the direction of spin of the electrons at the surface of the conductive layer 12 and the direction of magnetization of the storage layer have an angle θ. This allows a large spin transfer torque to be caused when a write current flows. As a result, data is written at a high speed.

Although a write operation has been described above, an operation to read data also needs to be considered in actual cases. In particular, if the magnetic memory is increased in capacity, and/or miniaturized, both the decrease in write energy and the increase in the resistance change rate (MR) of the magnetoresistive element need to be considered.

The above problem may be solved by crystallizing the interface of the storage layer with the nonmagnetic layer (for example, MgO), to be (001) oriented together with MgO. The MgO side of the storage layer is generally formed of an amorphous material such as Co and Fe, to which B (boron) is added. The MR of approximately 300% may be achieved by annealing the above workpiece to release the added element such as B and crystallizing Co or Fe. A material that may be combined with the added element such as B may be disposed around the interface. In the first to sixth embodiments and the first to fifth examples, adding, to the conductive layer, a material that may be combined with the element such as B added to the storage layer, and increasing the thickness of the conductive layer are effective to improve the MR.

Sixth Example

Figure 33:
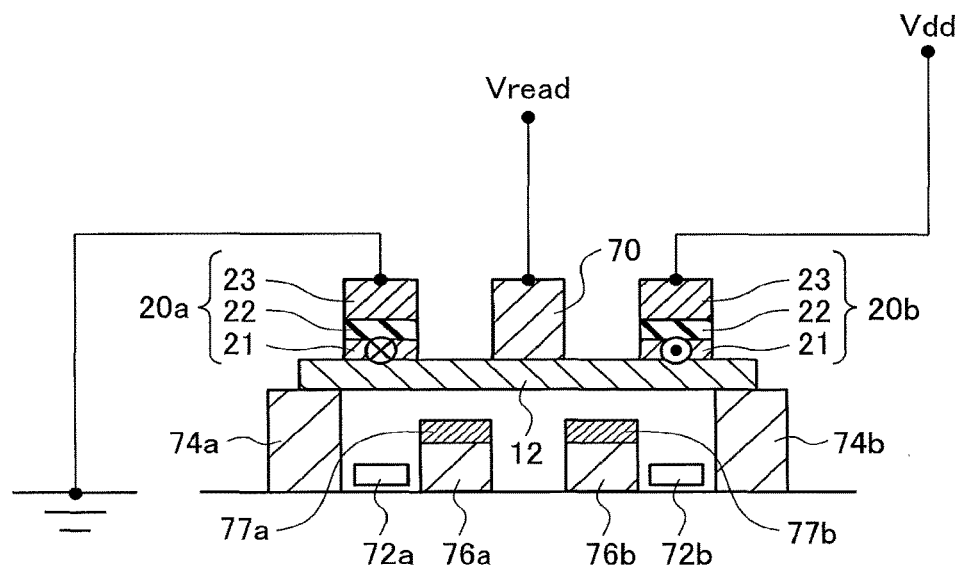
Figure 34:
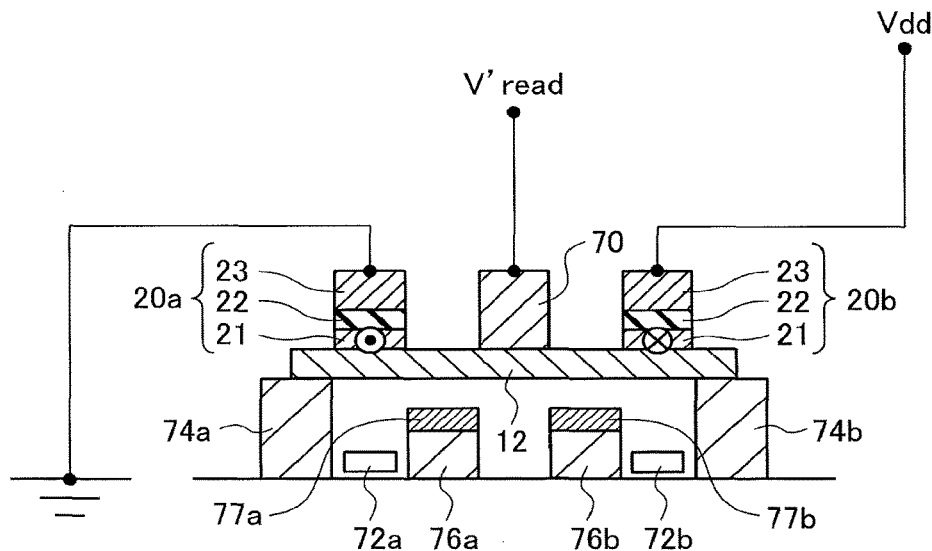

A sixth example of the magnetic memory will be described with reference to FIGS. 32 to 34. The sixth example of the magnetic memory is capable of read data at a high speed.

Figure 32:
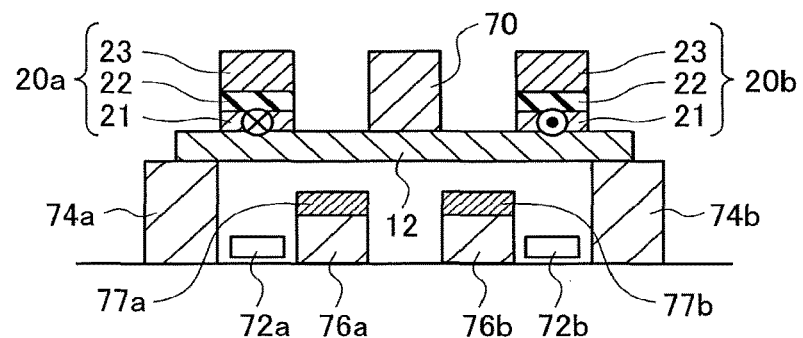
FIGS. 32 to 34 are cross-sectional views of a sixth example of a magnetic memory.

In the sixth example, a pair of MTJ elements 20a and 20b as shown in FIG. 32 represents 1 bit. The data to be stored in the MTJ element 20a has an opposite polarity to the data to be stored in the MTJ element 20b. A read electrode 70 is disposed between the MTJ elements 20a and 20b. A power supply voltage Vdd is applied to the reference layer 23 of the MTJ element 20b. The reference layer 23 of the MTJ element 20a is grounded. A read voltage Vread is applied to the electrode 70. As a result, data may be read via the electrode 70 (FIGS. 33 and 34). The above process may improve the data reliability and enable a high-speed reading of data. Transistors 72a and 72b are disposed under the conductive layer 12. One of source and drain of the transistor 72a is connected to the conductive layer 12 via a plug 74a, and the other is connected to a wiring line 77a via a plug 76a. One of source and drain of the transistor 72b is connected to the conductive layer 12 via a plug 74b, and the other is connected to a wiring line 77b via a plug 76b. Data is written to the MTJ element 20a by turning ON the transistor 72a to cause a write current to flow between the wiring line 77a and the electrode 70. Data is written to the MTJ element 20b by turning ON the transistor 72b to cause a write current to flow between the wiring line 77b and the electrode 70.

Seventh Example

Figure 35:
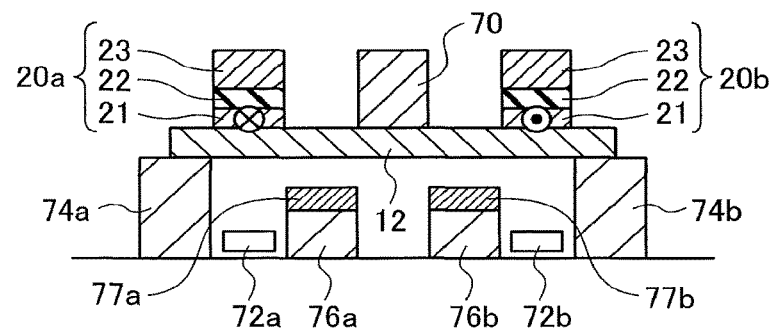
FIG. 35 is a cross-sectional view of a seventh example of a magnetic memory.
Figure 36:
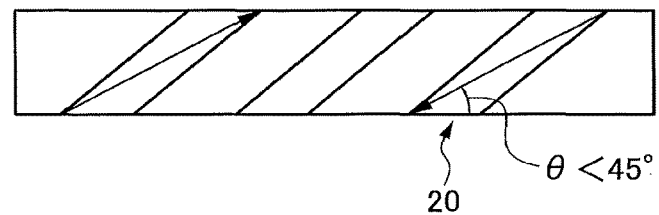
FIG. 36 is a plan view of the seventh example of the magnetic memory.

A seventh example of the magnetic memory will be described with reference to FIGS. 35 and 36. In the seventh example, the write speed is considerably improved. The major axis of the MTJ element is slanted to have an angle θ meeting the condition θ<45° (FIGS. 35 and 36). In the first to sixth examples, the write operation requires a finite time, for example several nanoseconds, since the magnetization of the storage layer is switched with the precession. However, the magnetization of the storage layer in the seventh example switches without causing the precession. Therefore, the write operation requires 1 ns or less to be completed.

Eighth Example

Figure 37:
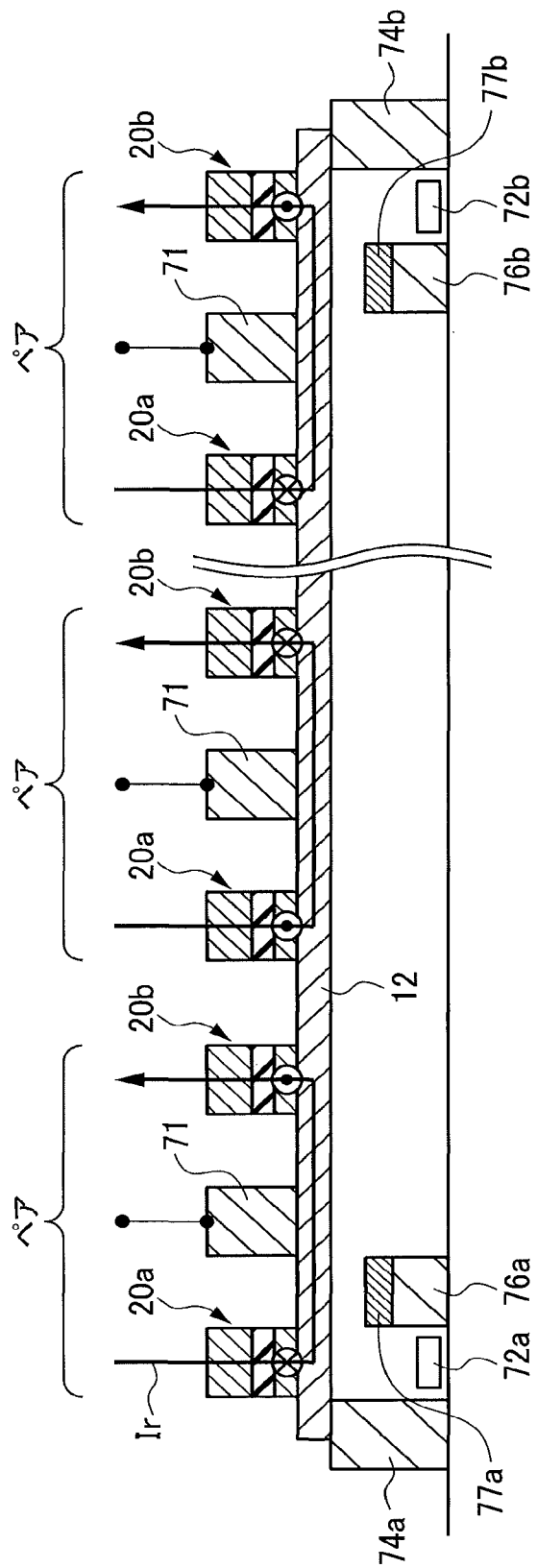
FIG. 37 is a cross-sectional view of an eighth example of a magnetic memory.

An eighth example of the magnetic memory will be described with reference to FIG. 37. The eighth example is used in a high-speed and middle-capacity memory such as a last level cache (LLC). The eighth example includes a plurality of bits disposed on the conductive layer 12, each bit including a pair of MTJ elements 20a and 20b and an electrode 71 disposed between the MTJ element 20a and 20b. The data to be stored in the MTJ element 20a has an opposite polarity to the data to be stored in the MTJ element 20b. An intermediate potential of the MTJ elements 20a and 20b is measured by means of the electrode 71.

Seventh Embodiment

Figure 38:
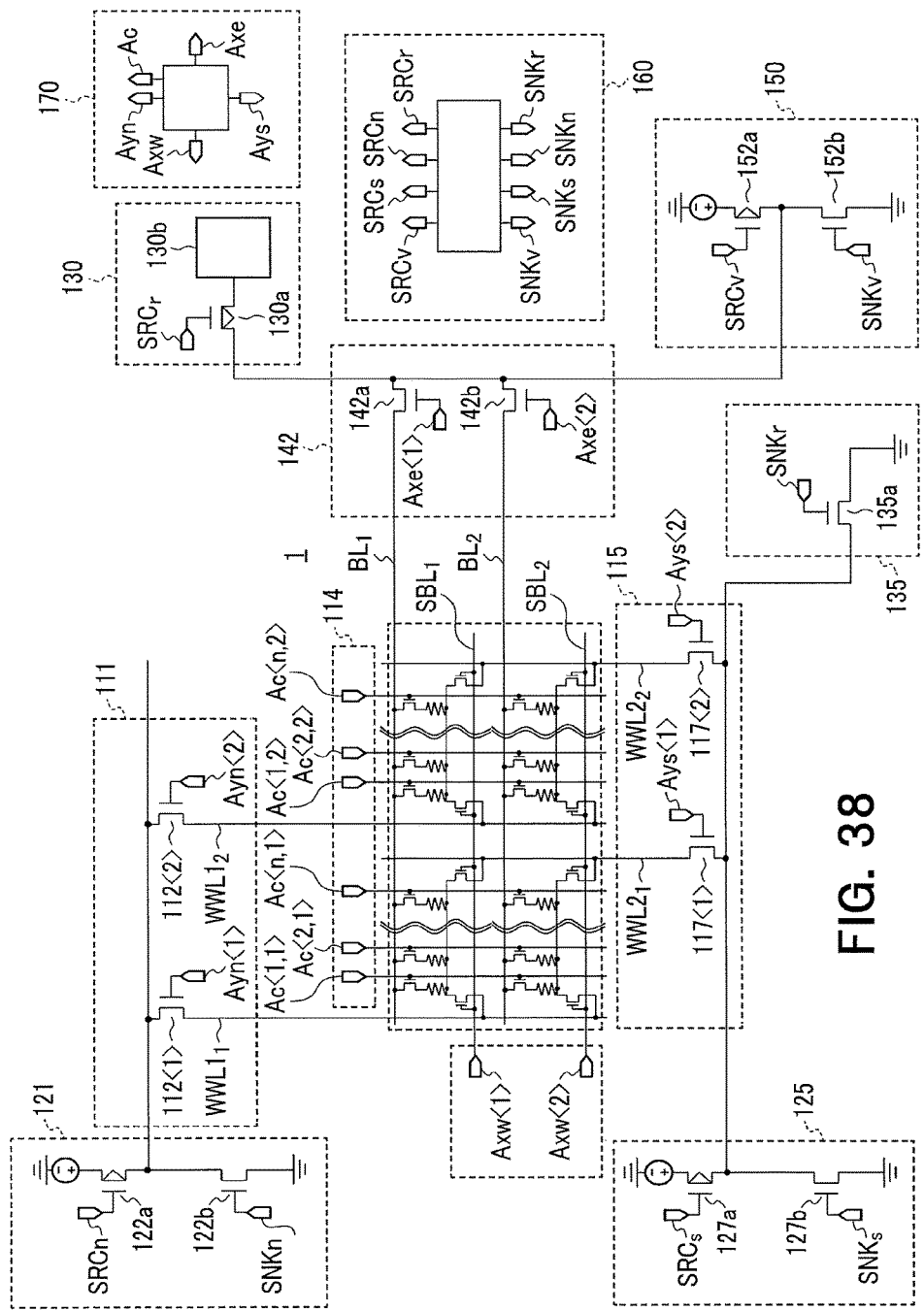
FIG. 38 is a circuit diagram illustrating a magnetic memory according to a seventh embodiment.

FIG. 38 shows a magnetic memory according to a seventh embodiment. The magnetic memory according to the seventh embodiment has a structure in which periphery circuits including write circuits and readout circuits are added to the magnetic memory 1 shown in FIG. 6.

The first writing word lines $WWL1_1$ and $WWL1_2$ of the magnetic memory 1 are connected to a first write circuit 121 through a first word line selection circuit 111. The first word line selection circuit 111 includes switching elements (FETs) 112<1> and 112<2> that are turned ON/OFF by control signals Ayn<1> and Ayn<2>.

A cell selection circuit 114 sends a control signal Ac<k, 1> (k=1, ..., 8) to the bit selection word line $bSWL_{k1}$ of the magnetic memory 1, and a control signal Ac<k, 2> (k=1, ..., 8) to the bit selection word line $bSWL_{k2}$ of the magnetic memory 1.

The second writing word lines $WWL2_1$ and $WWL2_2$ of the magnetic memory 1 are connected to a second write circuit 125 via a second word line selection circuit 115. The second word line selection circuit 115 includes switching elements (FETs) 117<1> and 117<2> that are turned ON/OFF by control signals Ays<1> and Ays<2>.

The first write circuit 121 includes switching elements (FETs) 122a and 122b that are turned ON/OFF by control signals SRCn and SNKn.

The second write circuit 125 includes switching elements (FETs) 127a and 127b that are turned ON/OFF by control signals SRCs and SNKs.

The byte selection bit lines $SBL_1$ and $SBL_2$ of the magnetic memory 1 receive control signals Axw<1> and Axw<2> sent from a second bit line selection circuit 140.

The bit lines $BL_1$ and $BL_2$ of the magnetic memory 1 are connected to a first readout circuit 130 and an MTJ voltage application circuit 150 via a first bit line selection circuit 142. The first bit line selection circuit 142 includes switching elements (FETs) 142a and 142b that are turned ON/OFF by control signals Axe<1> and Axe<2>.

The first readout circuit 130 includes a switching element (FET) 130a that is turned ON/OFF by a control signal SRCr, and a sense amplifier 139b.

A second readout circuit 135 includes a switching element (FET) 135a that is turned ON/OFF by a control signal SNKr, and is connected to the switching elements 117<1> and 117<2> of the second word line selection circuit 115.

The MTJ voltage application circuit 150 includes switching elements (FETs) 152a and 152b that are turned ON/OFF by control signals SRCv and SNKv.

The control signals SRCv, SRCs, SRCn, SRCr, SNKv, SNKs, SNKn, and SNKr are outputted from a control circuit 160.

The control signals Axw, Axe, Ayn, Ays, and Ac are outputted from a decoder 170.

In the seventh embodiment, the conductive layer through which a write current is caused to flow is selected by the first word line selection circuit 111, the second word line selection circuit 115, and the first bit line selection circuit 140. The polarity of the current is set by controlling the first write circuit 121 and the second write circuit 125. The MTJ element to which a voltage is applied during a write operation is selected by the first bit line selection circuit 142 and the cell selection circuit 114. The voltage applied to the MTJ element is adjusted by the MTJ voltage application circuit 150, the first write circuit 120, and the second write circuit 125.

The cell from which data is read is selected by the cell selection circuit 114, the second bit line selection circuit 140, the first bit line selection circuit 142, and the second word line selection circuit 115. The read current is caused to flow between the first readout circuit 130 and the second readout circuit 135.

The magnetic memory according to the seventh embodiment is capable of reducing energy consumption and reducing the number of half-selected bits to substantially solve the problem of erroneous writing, like the magnetic memory according to the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a conductive layer including a first terminal and a second terminal;
a plurality of magnetoresistive elements separately disposed on the conductive layer between the first terminal and the second terminal, each magnetoresistive element including a reference layer, a storage layer between the reference layer and the conductive layer, and a nonmagnetic layer between the storage layer and the reference layer; and
a circuit configured in a first write stage to apply a first potential to the reference layers of the plurality of the magnetoresistive elements and to flow a first write current between the first terminal and second terminal, and configured in a second write stage to apply a second potential to the reference layer or the reference layers of one or more of the plurality of the magnetoresistive elements to which data is to be written, and to flow a second write current between the first terminal and the second terminal in an opposite direction to the first write current.

2. The memory according to claim 1, further comprising:
a plurality of first transistors each corresponding to one of the magnetoresistive elements and including a third terminal, a fourth terminal, and a first control terminal, the third terminal electrically connecting to the reference layer of the corresponding one of the magnetoresistive elements; and
a second transistor including a fifth terminal, a sixth terminal, and a second control terminal, the fifth terminal electrically connecting to the first terminal.

3. The memory according to claim 2, wherein the first control terminals of the first transistors electrically connect to different ones of first wirings, and the fourth terminals electrically connect to a second wiring.

4. The memory according to claim 2, further comprising a third transistor including a seventh terminal, an eighth terminal, and a third control terminal, the seventh terminal electrically connecting to the second terminal.

5. The memory according to claim 4, wherein:
the first control terminals of the first transistors electrically connect to different ones of the first wirings, and the fourth terminals electrically connect to a second wiring; and
the second control terminal of the second transistor and the third control terminal of the third transistor electrically connect to a third wiring.

6. The memory according to claim 1, further comprising:
a plurality of diodes each corresponding to one of the magnetoresistive elements and including a cathode and an anode, one of the cathode and the anode electrically connecting to the reference layer of the corresponding one of the magnetoresistive elements; and
a first transistor including a third terminal, a fourth terminal, and a first control terminal, the third terminal electrically connecting to the first terminal.

7. The memory according to claim 6, further comprising a second transistor including a fifth terminal, a sixth terminal, and a second control terminal, the fifth terminal electrically connecting to the second terminal.

8. The memory according to claim 7, wherein the first control terminal and the second control terminal electrically connect to a first wiring.

9. The memory according to claim 1, wherein the nonmagnetic layer of the magnetoresistive element is an insulating layer.

10. The memory according to claim 1, wherein the circuit uses a plurality of write pulses to perform a write operation.

11. A magnetic memory comprising:
a first conductive layer including a first terminal and a second terminal;
a first magnetoresistive element and a second magnetoresistive element separately disposed on the first conductive layer between the first terminal and the second terminal, each of the first magnetoresistive element and the second magnetoresistive element including a reference layer, a storage layer between the reference layer and the first conductive layer, and a nonmagnetic layer between the storage layer and the reference layer; and a circuit configured in a first write stage to apply a first potential to the reference layers of the first magnetoresistive element and the second magnetoresistive element and to flow a first write current between the first terminal and the second terminal, and configured in a second write stage to apply a second potential to the reference layer of at least one of the first magnetoresistive element or the second magnetoresistive element to which data is to be written, and to flow a second write current between the first terminal and the second terminal in an opposite direction to the first write current.

12. The memory according to claim 11, wherein:

the conductive layer further includes a third terminal disposed between the first terminal and the second terminal, the first magnetoresistive element and the second magnetoresistive element being disposed between the first terminal and the third terminal, the magnetic memory further comprises a third magnetoresistive element and a fourth magnetoresistive element separately disposed on the first conductive layer between the second terminal and the third terminal, each of the third magnetoresistive element and the fourth magnetoresistive element including a reference layer, a storage layer between the reference layer and the first conductive layer, and a nonmagnetic layer between the storage layer and the reference layer;

the circuit is configured to apply the first potential to the reference layers of the first magnetoresistive element and the second magnetoresistive element and to flow the first write current between the first terminal and the third terminal, and to apply the second potential to the reference layer or the reference layers of at least one of the first magnetoresistive element or the second magnetoresistive element, to which data is to be written, and to flow the second write current between the first terminal and the third terminal, in a write operation to write data to the at least one of the first magnetoresistive element or the second magnetoresistive element; and the circuit is configured to apply a third potential to the reference layers of the third magnetoresistive element and the fourth magnetoresistive element and to flow a third write current between the second terminal and the third terminal, and to apply a fourth potential to the reference layer or the reference layers of at least one of the third magnetoresistive element or the fourth magnetoresistive element to which data is to be written and to flow a fourth write current between the second terminal and the third terminal in an opposite direction to the third write current, in a write operation to write data to the at least one of the third magnetoresistive element or the fourth magnetoresistive element.

13. The memory according to claim 11, further comprising a second conductive layer, wherein:

the first conductive layer includes a first portion, a second portion, and a third portion, the first portion being disposed between the second portion and the third portion;

the storage layer of the first magnetoresistive element is disposed between the second portion and the nonmagnetic layer of the first magnetoresistive element, and the storage layer of the second magnetoresistive element is disposed between the third portion and the nonmagnetic layer of the second magnetoresistive element; and the second conductive layer is disposed on the first portion.

14. The memory according to claim 11, further comprising a soft magnetic layer disposed on each of side portions of the first magnetoresistive element and the second magnetoresistive element.

15. The memory according to claim 11, wherein the circuit uses a plurality of write pulses to perform a write operation.

16. The memory according to claim 11, further comprising an electrode, the first conductive layer including a portion located between the first magnetoresistive element and the second magnetoresistive element, the electrode being located on the portion.

17. A magnetic memory comprising:

a conductive layer including a first terminal and a second terminal;

a plurality of magnetoresistive elements separately disposed on the conductive layer between the first terminal and the second terminal, each magnetoresistive element including a reference layer, a storage layer between the reference layer and the conductive layer, and a nonmagnetic layer between the storage layer and the reference layer;

a circuit configured in a first write stage to apply a first potential to the reference layers of the magnetoresistive elements and to flow a first write current between the first terminal and second terminal, and configured in a second write stage to apply a second potential to the reference layer or the reference layers of one or more of the magnetoresistive elements to which data is to be written, and to flow a second write current between the first terminal and the second terminal in an opposite direction to the first write current;

a first wiring, a second wiring, and a third wiring, the second wiring being electrically connected to the second terminal; and a first transistor including a third terminal electrically connected to the first terminal, a fourth terminal electrically connected to the first wiring, and a first control terminal electrically connected to the third wiring.

18. The memory according to claim 17, further comprising:

a plurality of second transistors each corresponding to one of the magnetoresistive elements and including a fifth terminal, a sixth terminal, and a second control terminal, the fifth terminal electrically connecting to the reference layer of the corresponding one of the magnetoresistive elements.

19. The memory according to claim 18, wherein the second control terminals of the second transistors electrically connect to different ones of fourth wirings, and the sixth terminals electrically connect to a fifth wiring.

20. The memory according to claim 18, wherein the second control terminals of the second transistors electrically connect to different ones of fourth wirings, and the sixth terminals electrically connect to different ones of fifth wirings.

* * * * *